United States Patent
Moon et al.

(10) Patent No.: US 10,923,556 B2
(45) Date of Patent: Feb. 16, 2021

(54) DISPLAY DEVICE

(71) Applicant: Samsung Display Co., Ltd., Yongin-si (KR)

(72) Inventors: Joong Soo Moon, Yongin-si (KR); Sun Ja Kwon, Yongin-si (KR); Min Woo Byun, Yongin-si (KR); Seung Yeon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/566,223

(22) Filed: Sep. 10, 2019

(65) Prior Publication Data

US 2020/0013848 A1    Jan. 9, 2020

Related U.S. Application Data

(63) Continuation of application No. 15/713,685, filed on Sep. 24, 2017, now Pat. No. 10,446,635.

(30) Foreign Application Priority Data

Jan. 10, 2017   (KR) .................. 10-2017-0003464

(51) Int. Cl.
*H01L 27/32*    (2006.01)
*G09G 3/3275*   (2016.01)
(Continued)

(52) U.S. Cl.
CPC ....... *H01L 27/3276* (2013.01); *G09G 3/3225* (2013.01); *G09G 3/3233* (2013.01); (Continued)

(58) Field of Classification Search
CPC ............. H01L 27/3276; H01L 27/1218; H01L 27/1248; H01L 27/3248; H01L 27/12;
(Continued)

(56) References Cited

U.S. PATENT DOCUMENTS 8,211,797 B2   7/2012   Yang et al.
8,933,344 B2   1/2015   Jeon
(Continued)

FOREIGN PATENT DOCUMENTS

JP    5952920          7/2016
KR    10-2012-0136743  12/2012
(Continued)

OTHER PUBLICATIONS

Notice of Allowance dated May 29, 2019, in U.S. Appl. No. 15/713,685.

(Continued)

*Primary Examiner* — Selim U Ahmed
*Assistant Examiner* — Evan G Clinton
(74) *Attorney, Agent, or Firm* — H.C. Park & Associates, PLC

(57) ABSTRACT

A display device includes a substrate which includes a display area and a non-display area, a pixel unit which is provided in the display area and includes a plurality of pixel columns, and data lines which are respectively connected to the pixel columns and apply data signals to the pixel columns. The non-display area includes a fanout area, a bent area, and a pad area which are sequentially arranged. The respective data lines are disposed on different layers in the fanout area and the pad area. A resulting display device can reduce resistance deviation between data signals in a first data line and a second data line, thereby reducing vertical line defects.

17 Claims, 21 Drawing Sheets

(51) Int. Cl.
*G09G 3/3225* (2016.01)
*H01L 27/12* (2006.01)
*G09G 3/3233* (2016.01)
*H01L 25/18* (2006.01)

(52) U.S. Cl.
CPC ........... *G09G 3/3275* (2013.01); *H01L 27/12* (2013.01); *H01L 27/1218* (2013.01); *H01L 27/1248* (2013.01); *H01L 27/3248* (2013.01); *G09G 2300/0404* (2013.01); *G09G 2300/0426* (2013.01); *G09G 2300/0452* (2013.01); *G09G 2310/0232* (2013.01); *G09G 2310/08* (2013.01); *G09G 2380/02* (2013.01); *H01L 25/18* (2013.01); *H01L 27/3218* (2013.01); *H01L 27/3262* (2013.01); *H01L 27/3265* (2013.01)

(58) Field of Classification Search
CPC . H01L 27/3265; H01L 27/3262; H01L 25/18; H01L 27/3218; H01L 27/3244; H01L 27/3206; G09G 3/3233; G09G 3/3225; G09G 3/3275; G09G 2310/0232; G09G 2300/0426; G09G 2380/02; G09G 2310/08; G09G 2300/0404; G09G 2300/0452
See application file for complete search history.

(56) References Cited

U.S. PATENT DOCUMENTS

| | | | |
|---|---|---|---|
| 9,274,389 B2 | 3/2016 | Kang et al. | |
| 2010/0155729 A1* | 6/2010 | Yang | G02F 1/1345 257/52 |
| 2015/0287378 A1 | 10/2015 | Jeong et al. | |
| 2015/0356937 A1* | 12/2015 | Fujikawa | G02F 1/136286 345/87 |
| 2016/0174304 A1* | 6/2016 | Kim | H05B 33/04 313/511 |
| 2018/0174511 A1 | 6/2018 | Kim et al. | |
| 2018/0188573 A1 | 7/2018 | Liu et al. | |

FOREIGN PATENT DOCUMENTS

| | | |
|---|---|---|
| KR | 10-2014-0045192 | 4/2014 |
| KR | 10-1380875 | 4/2014 |

OTHER PUBLICATIONS

Non-Final Office Action dated Dec. 13, 2018, in U.S. Appl. No. 15/713,685.

* cited by examiner

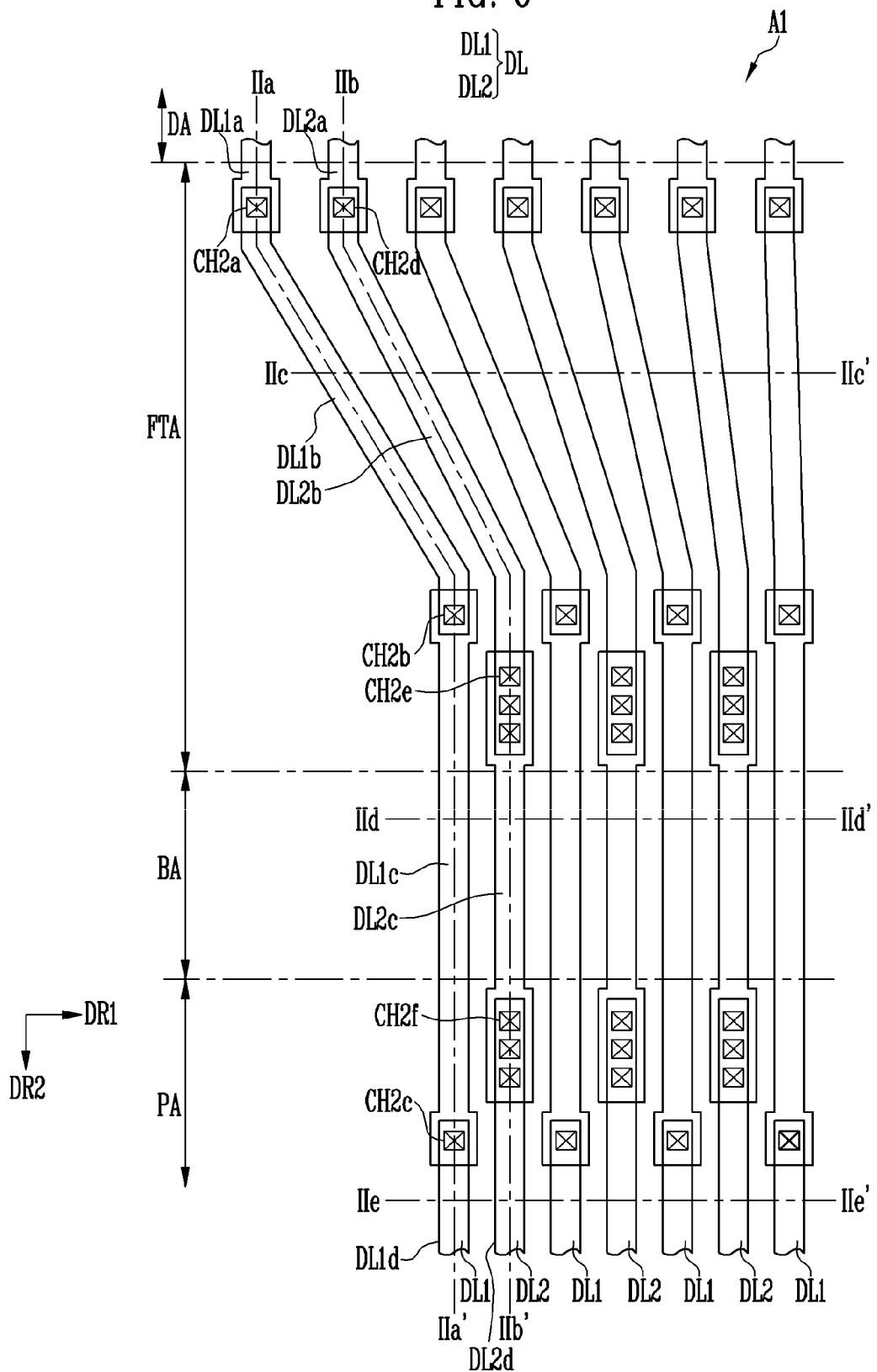

DISPLAY DEVICE

CROSS-REFERENCE TO RELATED APPLICATION

This application is a continuation of U.S. patent application Ser. No. 15/713,685, filed Sep. 24, 2017, which issued as U.S. Pat. No. 10,446,635, and claims priority to and the benefit of Korean Patent Application No. 10-2017-0003464, filed Jan. 10, 2017, each of which is hereby incorporated by reference for all purposes as if fully set forth herein.

BACKGROUND

Field

An exemplary embodiment according to the inventive concepts relates to a display device.

Discussion of the Background

An organic light emitting display device displays an image by using an organic light emitting diode which is a self-light emitting element, and is attracting attention as a next generation display device by virtue of higher luminance and color purity. The organic light emitting display device includes a plurality of pixels configured with red pixels, green pixels, and blue pixels to display various color images. The red pixels, the green pixels, and the blue pixels may be arranged in various shapes, but are generally arranged in a stripe pixel arrangement. However, if the pixels are arranged in the stripe type, an aperture ratio may decrease due to a black matrix disposed between the respective pixels and the ability to display high-resolution may decrease. To improve ability for a display device to have high-resolution, a high-resolution Pentile matrix pixel arrangement is proposed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting display device, and particularly an organic light emitting display device having a Pentile matrix pixel arrangement.

According to an exemplary embodiment of the inventive concepts, a display device includes a substrate which include a display area and a non-display area, a pixel unit which is disposed in the display area and includes a plurality of pixel columns, and data lines which are respectively connected to the pixel columns and apply data signals to the pixel columns. The non-display area includes a fanout area, a bent area, and a pad area which are sequentially arranged. The respective data lines are disposed on different layers in the fanout area and the pad area.

According to an exemplary embodiment, the pixel column may include a first pixel column including a plurality of pixels, and a second pixel column including a plurality of pixels.

According to an exemplary embodiment, the data line may include a first data line which is connected to the first pixel column and a second data line which is connected to the second pixel column, and the first data line and the second data line may be disposed on different layers in the fanout area and the pad area.

According to an exemplary embodiment, the display device may further include first to third insulating films which are sequentially disposed on the substrate, and the first data line may be disposed on one layer of the first and second insulating films in the fanout area and may be disposed on the other layer of the first and second insulating films in the pad area.

According to an exemplary embodiment, the second data line may be disposed on the other layer of the first and second insulating films in the fanout area and may be disposed on the one layer of the first and second insulating films in the pad area.

According to an exemplary embodiment, the display device may further include a bent portion insulating film which is disposed in the bent area of the substrate.

According to an exemplary embodiment, the first to third insulating films may include openings which expose a part of the substrate in the bent area, and the bent portion insulating film may be provided within the opening.

According to an exemplary embodiment, the first and second data lines may be disposed on the bent portion insulating film in the bent area.

According to an exemplary embodiment, the display device may further include a fourth insulating film being disposed on the third insulating film and the bent portion insulating film, the first data line may be disposed on one layer of the bent portion insulating film and the fourth insulating film in the bent area, and the second data line may be disposed on the other layer of the bent portion insulating film and the fourth insulating film in the bent area.

According to an exemplary embodiment, the first data lines may be respectively disposed on the bent portion insulating film and the fourth insulating film in the bent area, and the second data lines may be respectively disposed on the bent portion insulating film and the fourth insulating film in the bent area.

According to an exemplary embodiment, a plurality of the first pixel column and a plurality of the second pixel column may be provided, and the first pixel columns and the second pixel columns may be alternately arranged in a row direction.

According to an exemplary embodiment, a plurality of the first data lines and a plurality of the second data lines may be provided, and the first data lines and the second data lines may be alternately arranged in the row direction.

According to an exemplary embodiment, the first pixel column may include first pixels which are provided in the display area and represent a first color in a column direction, and the second pixel column may include second pixels which represent a second color and third pixels which are alternately arranged with the second pixels and represent a third color.

According to an exemplary embodiment, the first color may be green, the second color may be red, and the third color may be blue.

According to an exemplary embodiment, areas of at least two pixels of the first pixels, the second pixels, and the third pixels may be different from each other.

According to an exemplary embodiment, delays of data signals which are applied to the first pixel column and the second pixel column in the display area may be different from each other, and a contact structure in which the first data line that is connected to the first pixel column and the second data line that is connected to the second pixel column may have different resistances from each other is provided.

According to an exemplary embodiment, a delay value of a signal which is applied to the first data line may be larger than a delay value of a signal which is applied to the second data line, in the display area, and a contact structure with lower resistance may be connected to the first data line in the non-display area.

According to an exemplary embodiment, each of the first and second data lines may be connected to each other through at least one contact hole, and the first data line may pass through the number of contact holes which is smaller than the second data line, in the non-display area.

According to an exemplary embodiment, the display device may further include a data drive unit being mounted in the pad area of the substrate, being connected to the data lines, and providing a data signal.

According to an exemplary embodiment, the display device may further include a chip on film being connected to the pad area and configured to provide the data lines with the data signal.

According to the embodiments of the present disclosure, there is provided a display device which reduces resistance deviation between data signals in a first data line and a second data line, thereby reducing vertical line defects.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 6 illustrates data lines of the display device according to an exemplary embodiment of the inventive concepts and is a plan view illustrating a portion corresponding to A1 of FIG. 2.

DETAILED DESCRIPTION OF THE ILLUSTRATED EMBODIMENTS

Figure 1:
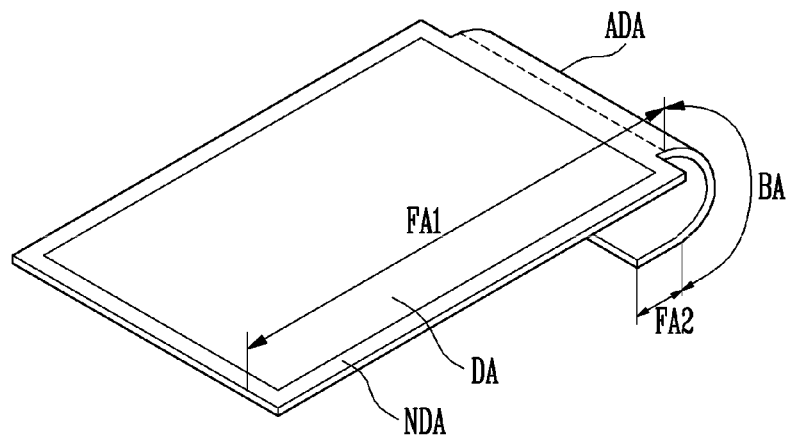
FIG. 1 is a perspective view illustrating a display device according to an exemplary embodiment of the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the inventive concepts.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments of the inventive concepts will be described in more detail with reference to the accompanying drawings.

Figure 2:
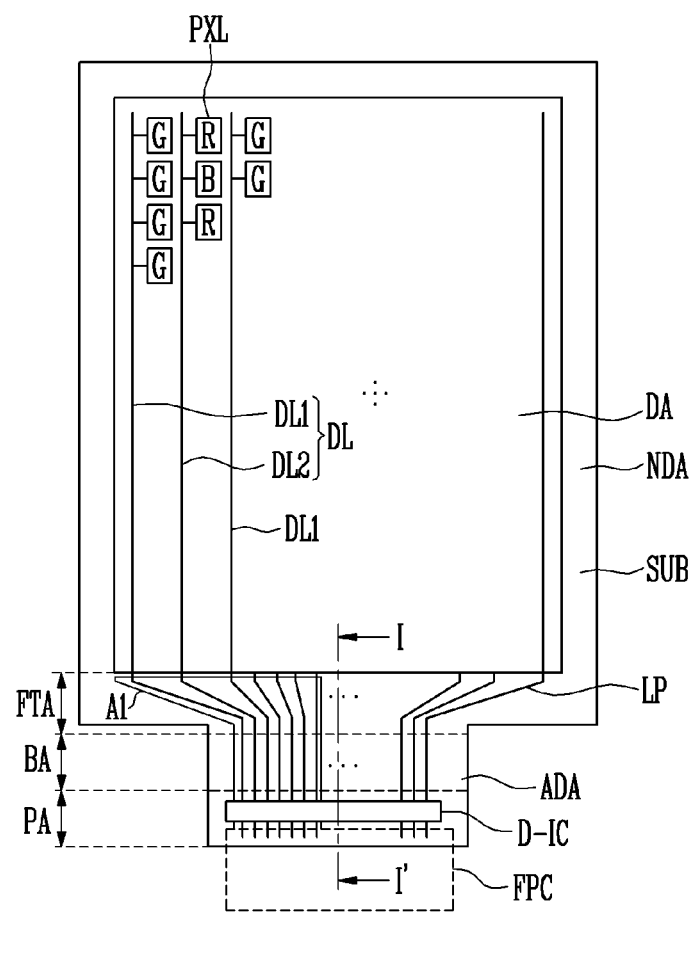
FIG. 2 is a plan view illustrating the display device of FIG. 1.

FIG. 1 is a perspective view illustrating a display device according to an exemplary embodiment of the inventive concepts, and FIG. 2 is a plan view illustrating the display device of FIG. 1.

Referring to FIG. 1 and FIG. 2, the display device according to the an exemplary embodiment of the inventive concepts includes a substrate SUB, a plurality of pixels PXL which are disposed on the substrate SUB, and a wiring portion which is connected to the pixels PXL.

The substrate SUB includes a display area DA and a non-display area NDA which is disposed on at least one side of the display area DA.

The substrate SUB may have a substantially quadrangular shape, and in particular, have a substantially rectangular shape, but aspects of the inventive concepts are not limited thereto. In an exemplary embodiment of the inventive concepts, the substrate SUB may, for example, include a pair of shorter sides parallel to each other in a first direction DR1 and a pair of longer sides parallel to each other in a second direction DR2.

However, the shape of the substrate SUB is not limited to the above examples, and may be formed in various shapes. For example, the substrate SUB may be configured with any one of the various shapes, including but not limited to, a closed polygon including a straight side, a circle or an ellipse configured by a curved line, a semi-circle or a semi-ellipse including a straight line and a curved line, and the like. In an exemplary embodiment of the inventive concepts, if the substrate SUB has straight sides, at least a part of each corners of the substrate SUB may be configured in curved lines. For example, if the substrate SUB has a substantially rectangular shape, a portion where adjacent straight sides meet may be replaced with a curved line with a predetermined curvature. That is, a vertex portion of a rectangular shape may be configured in a curved line in which both adjacent ends are connected to adjacent two straight sides and which has a predetermined curvature. The curvature may be set differently depending on the location. For example, the curvature may be set differently depending on a location where a curved line starts, the length of the curved line, and the like.

The display area DA is an area where a plurality of pixels PXL is disposed to display an image. The display area DA may have a shape corresponding to a shape of the substrate SUB. For example, the display area DA may be configured with any one of various shapes, including but not limited to, a closed polygon including a straight side, a circle or an ellipse configured by a curved line, a semi-circle or a semi-ellipse including a straight line and a curved line, and the like, in the same manner as the shape of the substrate SUB. In an exemplary embodiment of the inventive concepts, if the display area DA has straight sides, at least a part of the corners of the display area DA may be configured in curved lines.

The pixels PXL are disposed on the display area DA of the substrate SUB. Each pixel PXL is a minimum unit for displaying an image, and may be plural. The pixels PXL may emit white light and/or color light. Each pixel PXL may emit any one of red light, green light, and blue light, but is not limited thereto, and may emit, for example, cyan light, magenta light, yellow light, or the like.

The pixel PXL may be a light emitting element including an organic light emitting layer, but is not limited thereto, and may be realized by various elements including but not limited to, a liquid crystal element, an electrophoresis element, or an electrowetting element within a range in which the inventive concepts is maintained.

In an exemplary embodiment of the inventive concepts, the non-display area NDA may further include an additional display area ADA protruded from a part thereof. The additional display area ADA may protrude from sides configuring the non-display area NDA. An exemplary embodiment of the inventive concepts discloses that the additional display area ADA protrudes from a side corresponding to one of shorter sides of the substrate SUB. However, the additional display area ADA may protrude from one of longer sides, or may, for example, protrude from two sides or more of the four sides of the substrate SUB. In an exemplary embodiment of the inventive concepts, a data drive unit D-IC may be disposed in the additional display area ADA. However, configuration elements which are disposed in the additional display area ADA are not limited thereto, and other various configuration elements may be disposed therein.

In an exemplary embodiment of the inventive concepts, at least a part of the display device inventive concepts may have flexibility, and the part with flexibility may be folded. That is, the display device may include a bent area BA which has flexibility and is bent in a direction, and a flat area FA which is provided on at least one side of the bent area BA and is flat. The flat area FA may have flexibility or may not have flexibility.

In an exemplary embodiment of the inventive concepts, the bent area BA is provided in the additional display area ADA as an example. According to an exemplary embodiment of the inventive concepts, the bent area BA may be interposed between a first flat area FA1 and a second flat area FA2 which are separated from each other, and the first flat area FA1 may include the display area DA. In an exemplary embodiment of the inventive concepts, the bent area BA may be separated from the display area DA.

When a line which is obtained by folding the display device in the bent area BA is referred to as a fold line, the fold line is provided within the bent area BA. Here, the term "folded" means that a shape may be not fixed but deformed into a different shape from an original shape, including, for example, that one or more predetermined wires are folded or curved along a fold line, or are rolled in a scroll shape. Thus, in an exemplary embodiment of the inventive concepts, one side of the first flat area FA1 and one side of the second flat area FA2 are folded in parallel to face each other, but are not limited thereto, and may, for example, be folded with a predetermined angle (for example, acute angle, right angle or obtuse angle) in a state where the bent area BA is interposed therebetween.

In an exemplary embodiment of the inventive concepts, the additional display area ADA may be bent along the fold line, and in this case, a width of bezel may be reduced by bending the additional display area ADA.

Figure 3A:
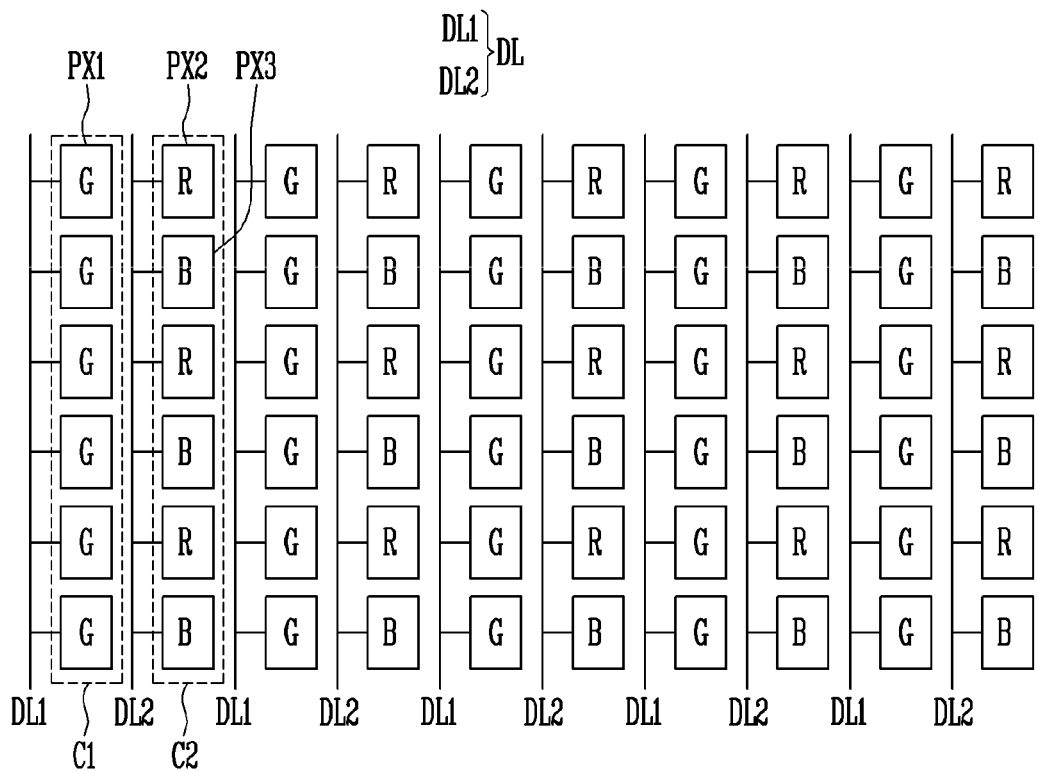
FIG. 3A and FIG. 3B are plan views illustrating pixel units arranged in a display region in the display device according to an exemplary embodiment of the inventive concepts.
Figure 3B:
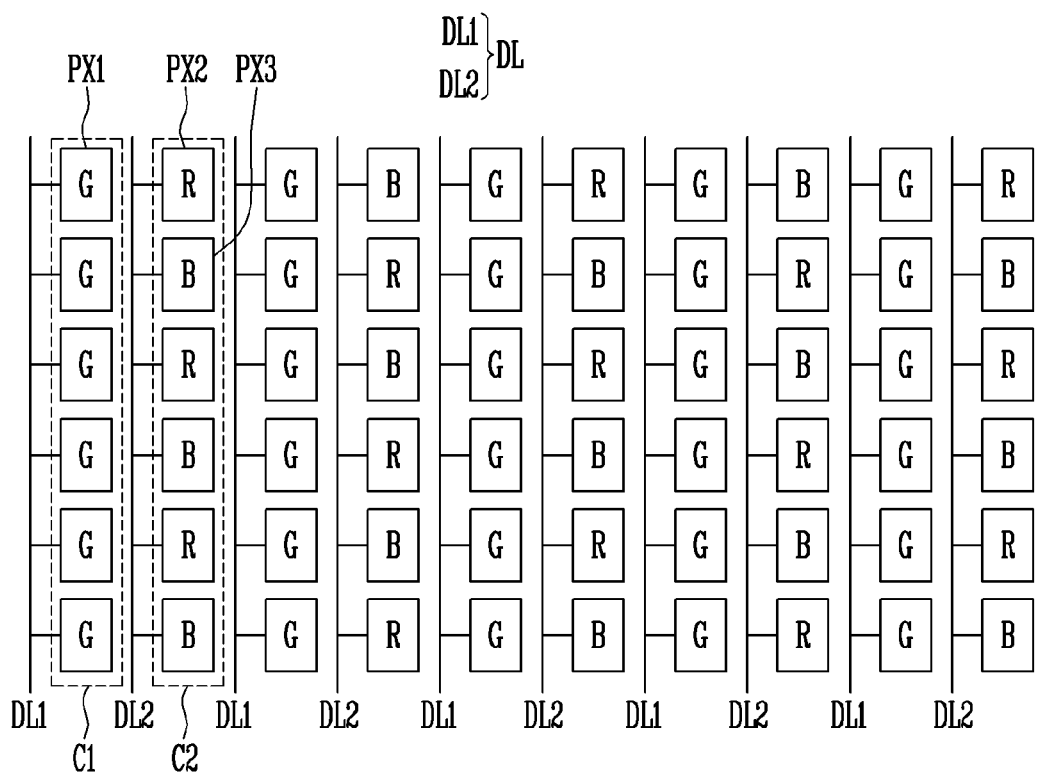

FIGS. 3A and 3B are plan views illustrating pixel units arranged in a display region in the display device according to an exemplary embodiment of the inventive concepts.

Referring to FIG. 2 and FIGS. 3A and 3B, the display device includes the pixel units which display an image, and the pixel unit includes a plurality of pixels PXL.

In an exemplary embodiment of the inventive concepts, the pixels PXL may be arranged in a matrix along rows extended in a first direction DR1 and columns extended in a second direction DR2. However, an arrangement of the pixels PXL is not limited in particular, and may be arranged in various ways.

The pixels PXL include first pixels PX1 which display a first color, second pixels PX2 which display a second color, and third pixels PX3 which display a third color.

In an exemplary embodiment of the inventive concepts, the first color may be green, the second color may be red, and the third color may be blue. However, the first to third colors are not limited thereto, and may be other colors.

As illustrated in FIG. 3A, the first pixels PX1 may be arranged in a column direction to form a first pixel row C1. For example, the first pixel PX1, the first pixel PX1, the first pixel PX1, . . . may be sequentially arranged in the first pixel row C1. The second pixels PX2 and the third pixels PX3 may be alternately arranged in a column direction to form a second pixel row C2. For example, the second pixel PX2, the third pixel PX3, the second pixel PX2, the third pixel PX3, . . . may be sequentially arranged in the second pixel row C2.

In an exemplary embodiment of the inventive concepts, a pixel arrangement sequence of the second pixel row C2 may be changed. For example, as illustrated in FIG. 3B, the second pixels PX2, the third pixel PX3, the second pixel PX2, the third pixel PX3, . . . may be sequentially arranged in one of the second pixel rows C2, and the third pixels PX3, the second pixels PX2, the third pixels PX3, the second pixels PX2, . . . may be sequentially arranged in the other second pixel rows C2. Accordingly, in an exemplary embodiment of the inventive concepts, the first pixel PX1, the second pixel PX2, the first pixel PX1, the second pixel PX2, may be sequentially arranged in a row direction as illustrated in FIG. 3A, or the first pixel PX1, the second pixel PX2, the first pixel PX1, the third pixel PX3, . . . may be sequentially arranged in a row direction as illustrated in FIG. 3B. In an exemplary embodiment of the inventive concepts, the first pixel PX1, the third pixel PX3, the first pixel PX1, the second pixel PX2, . . . may be sequentially arranged in a row direction.

The display area DA may include a plurality of first pixel rows C1 and second pixel rows C2, where the first pixel rows C1 and second pixel rows C2 are alternately arranged in a row direction. Accordingly, the first pixels PX1 and the second pixels PX2 may be alternately arranged in an nth row when any one row, for example, an arbitrary row is used as a reference. For example, the first pixel PX1, the second pixel PX2, the first pixel PX1, the second pixel PX2, the first pixel PX1, . . . may be sequentially arranged in an nth row, while the first pixels PX1 and the third pixels PX3 may be alternately arranged in an $(n-1)^{th}$ row or an $(n+1)^{th}$ row. For example, the first pixel PX1, the third pixel PX3, the first pixel PX1, the third pixel PX3, the first pixel PX1, . . . may be sequentially arranged in the $(n-1)^{th}$ row or the $(n+1)^{th}$ row.

The pixel rows are respectively connected to data lines DL. The pixels PXL of the first pixel row C1 may be connected to first data lines DL1. For example, the first pixels PX1 of the first pixel row C1 are connected to the first data line DL1. The pixels PXL of the second pixel row C2 may be connected to second data lines DL2. For example, the second pixels PX2 and the third pixels PX3 of the second pixel row C2 are connected to the second data line DL2. Accordingly, the first data lines DL1 and the second data lines DL2 may also be alternately arranged in a row direction in the same manner as the first pixel rows C1 and the second pixel rows C2.

The data drive unit D-IC connected to each data line DL may be provided in the additional display area ADA. In an exemplary embodiment of the inventive concepts, the data drive unit D-IC may be directly mounted on a substrate SUB.

The arrangement structure of the first pixels PX1 to the third pixels PX3 corresponds to the Pentile matrix pixel arrangement. As the Pentile matrix pixel arrangement in an exemplary embodiment of the inventive concepts employs rendering drive to represent colors by sharing adjacent pixels PXL, it is possible to achieve a higher resolution with a smaller number of pixels PXL.

In an exemplary embodiment of the inventive concepts, the first pixel PX1, the second pixel PX2, and the third pixel PX3 may have the same area as each other, but are not limited thereto. For example, areas of at least two pixels PXL of the first pixel PX1, the second pixel PX2, and the third pixel PX3 may be different from each other. The first pixel PX1, the second pixel PX2, and the third pixel PX3 may respectively have different areas from each other, and areas of two pixels PXL among the first pixel PX1, the second pixel PX2, and the third pixel PX3 may be the same and an area of the remaining pixel may be different from the two pixels. For example, the area of the third pixel PX3 representing blue which is a third color may be larger than the area of the second pixel PX2 representing red which is a second color and/or the area of the first pixel PX1 representing green which is a first color. Alternatively, the areas of the second pixel PX2 and the third pixel PX3 may be the same as each other, and the area of the first pixel PX1 may be smaller than the areas of the second pixel PX2 and the third pixel PX3. But exemplary embodiments of the inventive concepts are not limited thereto.

Figure 4:
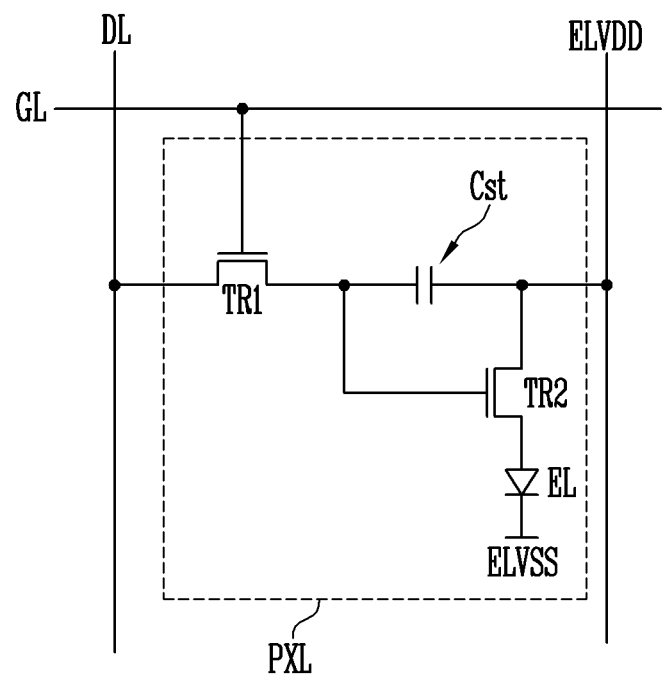
FIG. 4 is an equivalent circuit diagram illustrating a case where a pixel according to an exemplary embodiment of the inventive concepts is a light emitting element.

FIG. 4 is an equivalent circuit diagram illustrating an exemplary embodiment where the pixel PXL according to an exemplary embodiment of the inventive concepts is a light emitting element.

Referring to FIG. 4, each pixel PXL may include a thin film transistor connected to a wiring portion, a light emitting element EL connected to the thin film transistor, and a capacitor Cst.

The thin film transistor may include a drive thin film transistor TR2 for controlling the light emitting element EL, and a switching thin film transistor TR1 which switches the drive thin film transistor TR2. In an exemplary embodiment of the inventive concepts, one pixel PXL may include two thin film transistors TR1 and TR2, but are not limited thereto, and one pixel PXL may include, for example, one thin film transistor and one capacitor, or one pixel PXL may include three or more thin film transistors and two or more capacitors. For example, one pixel PXL may include seven thin film transistors, one light emitting element, and one storage capacitor.

The switching thin film transistor TR1 includes a gate electrode, a source electrode, and a drain electrode. The switching thin film transistor TR1 has the gate electrode connected to a gate line GL and the source electrode connected to the data line DL. The drain electrode is connected to a gate electrode of the drive thin film transistor TR2. The switching thin film transistor TR1 transmits a data signal which is applied to the data line DL to the drive thin film transistor TR2 in response to a scan signal which is applied to the gate line GL.

The drive thin film transistor TR2 includes the gate electrode, a source electrode, and a drain electrode. The drive thin film transistor TR2 has the gate electrode connected to the switching thin film transistor TR1, the source electrode connected to a first power supply line ELVDD, and the drain electrode connected to the light emitting element EL.

The light emitting element EL includes a light emitting layer, and first and second electrodes which interpose the light emitting layer therebetween and face each other. The first electrode is connected to the drain electrode of the drive thin film transistor TR2. The second electrode is connected to a second power supply line ELVSS and a common voltage is applied thereto. The light emitting layer emits light or does not emit light in response to an output signal of the drive thin film transistor TR2, and thereby, an image is displayed. Here, light which is emitted from the light emitting layer may change depending on a material of the light emitting layer, and may be color light or white light.

The capacitor Cst is connected to the gate electrode and the source electrode of the drive thin film transistor TR2, and stores and maintains the data signal which is input to the gate electrode of the drive thin film transistor TR2.

Referring to FIG. 1 to FIG. 4 again, the non-display area NDA does not include the pixels PXL, and thus, does not display an image.

The non-display area NDA may include a fanout area FTA disposed between the display area DA and the bent area BA, and a pad area PA located at the outside of the bent area. Accordingly, the display area DA, the fanout area FTA, the bent area BA, and the pad area PA may be sequentially arranged.

The fanout area FTA is an area where a wiring portion of the display area DA extends to the bent area BA. The lines extending in the second direction DR2 in the display area DA are provided in a fan shape in which gaps are gradually narrowed in the fanout area FTA. The wiring portion may include wires of various types, and the types are not limited. For example, a wiring portion may provide signals to each pixel PXL, may include a gate line, data line, a first power supply line, a second power supply line, and the like, and may further include other lines if necessary.

In an exemplary embodiment of the inventive concepts, an exemplary embodiment where wires of the wiring portion are data lines is described as an example.

In an exemplary embodiment of the inventive concepts, the data lines DL may extend substantially in the second direction DR2 and may be separated from each other. As the data lines DL extend in the second direction DR2, a distance between adjacent data lines DL may be gradually narrowed or widened. In an exemplary embodiment of the inventive concepts, a distance between the adjacent data lines DL may be gradually narrowed in the second direction DR2 in the fanout area FTA.

The bent area BA is a portion where the wiring portion extends from the fanout area FTA to the pad area PA. The wires which extend substantially in the second direction DR2 in the fanout area FTA extend in parallel in the second direction DR2 in the bent area BA.

The pad area PA overlaps the second flat area FA2, and includes the data drive unit D-IC and contact electrodes CTE connected to the data drive unit D-IC and external configuration elements (for example, wires of a flexible printed circuit board FPC). The wires extending in the second direction DR2 may also extend in the second direction DR2 in the pad area PA in a state where the data drive unit D-IC is interposed therebetween, and the contact electrodes CTE are provided in end portions thereof.

Accordingly, the data lines DL may be disposed over the display area DA and the non-display area NDA. The data drive unit D-IC may be connected to an end portion of the wiring portion. The data drive unit D-IC may provide signals to each pixel PXL through the data lines DL, thereby, controlling drive of each pixel PXL.

In an exemplary embodiment of the inventive concepts, a drive unit may include a scan drive unit (not illustrated) which provides scan signals to each pixel PXL through the gate lines GL, and a timing control unit (not illustrated) which controls the scan drive unit and the data drive unit. In an exemplary embodiment of the inventive concepts, the data drive unit D-IC provided in the additional display area ADA is illustrated, and other drive units such as the scan drive unit or the timing control unit provided in a form of a chip-on-film are not illustrated. However, exemplary embodiments of the inventive concepts are not limited thereto, and other drive units such as the scan drive unit may be provided in a form being mounted in the non-display area NDA. In an exemplary embodiment of the inventive concepts, the scan drive unit is may be directly mounted on the substrate SUB. If the scan drive unit is directly mounted on the substrate SUB, this may be performed together with a process of forming the pixels PXL. However, a location where the scan drive unit is provided or a method of providing the scan drive unit are not limited thereto, and the scan drive unit may be formed in another chip and be provided in a form of chip-on-glass on the substrate SUB, or may be mounted on a printed circuit board to be connected to the substrate SUB through a connection member.

Figure 5:
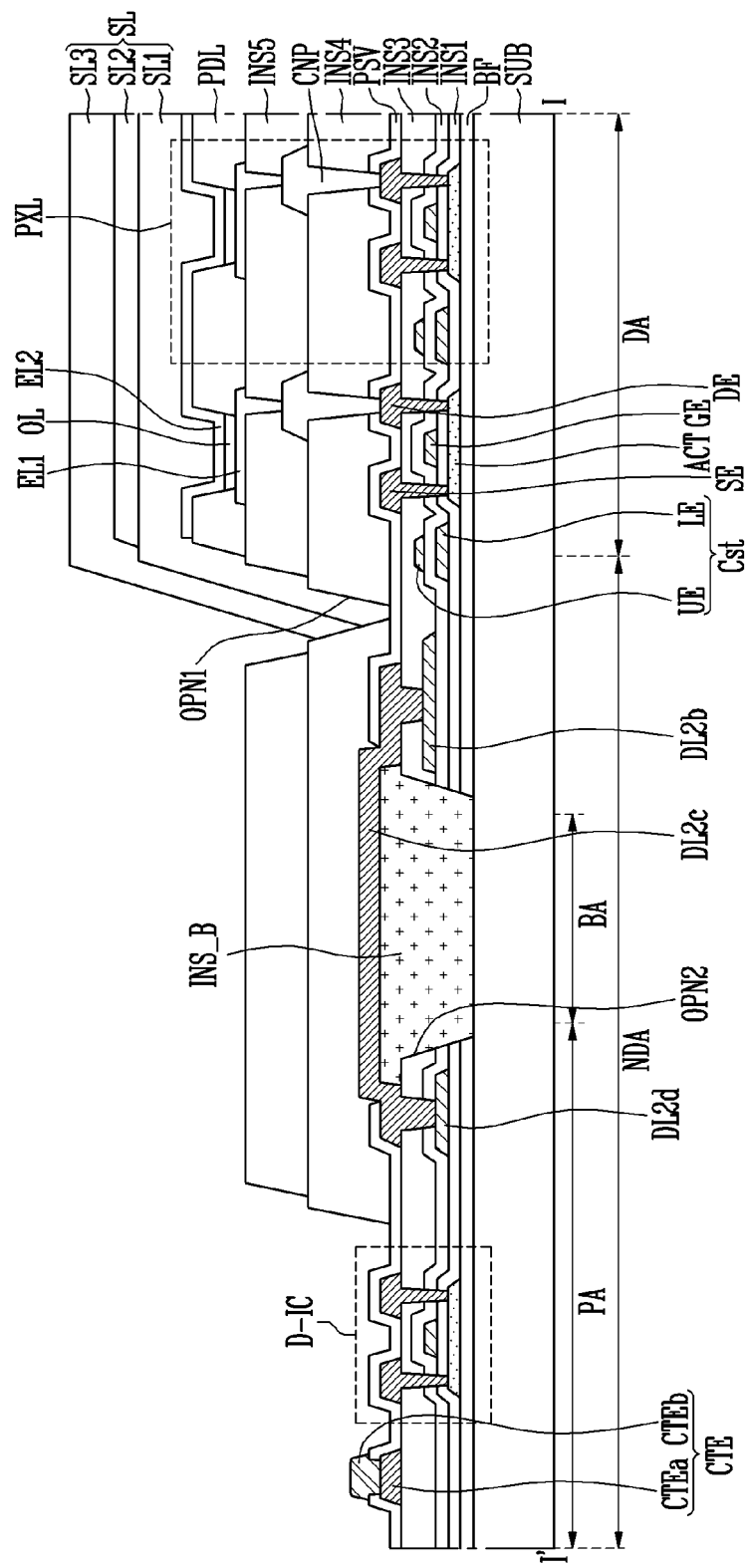
FIG. 5 is a cross sectional view taken along a line I-I' of FIG. 2 and illustrates a part of the pixels in the display region and a non-display region.

FIG. 5 is a cross sectional view taken along a line I-I' of FIG. 2 and illustrates a part of the pixels in the display region DA and the non-display region NDA. FIG. 5 conceptually illustrates the display device according to an exemplary embodiment of the inventive concepts, and partial configuration elements are expanded or contracted for the sake of convenience of description.

The display device according to an exemplary embodiment of the inventive concepts has a part with a bent shape as illustrated in FIG. 1, and the display device which is not bent is illustrated in FIG. 5 for the sake of convenience of description. It is noted that the display device which is not bent is illustrated in the cross sectional views, the plan views, and the like according to an exemplary embodiment that will be described below for the sake of convenience of illustration.

Hereinafter, the display device according to an exemplary embodiment of the inventive concepts will be described in detail with reference to FIG. 1 to FIG. 5.

The display area DA will be first described and thereafter, the non-display area NDA will be described.

In an exemplary embodiment of the inventive concepts, a plurality of pixels PXL is provided in the display area DA. Each pixel PXL includes a transistor connected to corresponding lines among the lines of the wiring portion LP, a light emitting element connected to the transistor, and a capacitor Cst. The transistor may include a drive transistor for controlling the light emitting element and a switching transistor which switches the drive transistor.

The pixels PXL according to an exemplary embodiment of the inventive concepts are disposed on the substrate SUB.

The substrate SUB may be configured with an insulating material such as, for example, glass or resin. In addition, the substrate SUB may be configured with a material with flexibility which can be bent or folded, and may have a single layer or a multilayer structure.

For example, the substrate SUB may contain at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and polyurethane. However, a material configuring the substrate SUB is not limited thereto, and may be changed. For example, the substrate SUB may also be configured with fiber reinforced plastic (FRP) and the like.

A buffer layer BF is disposed on the substrate SUB. The buffer layer BF protects the switching transistor and drive transistors against diffusion of impurity. The buffer layer BF may be configured in a single layer or in a multilayer.

The buffer layer BF may be an inorganic insulating film formed of an inorganic material. For example, the buffer layer BF may be formed of silicon nitride, silicon oxide, silicon oxynitride, or the like. If the buffer layer BF is a multilayer, each layer may be formed of the same material or may be formed of materials different from each other. The buffer layer BF may be omitted depending on a material or process conditions of the substrate SUB.

An active pattern ACT is disposed on the buffer layer BF. The active pattern ACT is formed of a semiconductor material. The active pattern ACT may include a source area, a drain area, and a channel area which is disposed between the source area and the drain area. The active pattern ACT may be a semiconductor pattern formed of polysilicon, amorphous silicon, an oxide semiconductor, or the like. The channel area is a semiconductor pattern which is not doped with impurity, and may be an intrinsic semiconductor. The source area and the drain area may have semiconductor patterns which are doped with impurity. Impurity such as b-type impurity, p-type impurity, or a metal may be used as the impurity.

A first insulating film INS1 may be disposed on the active pattern ACT. The first insulating film INS1 may be an inorganic insulating film formed of an inorganic material, and may be an organic insulating film formed of an organic material. An inorganic insulating material such as polysiloxane, silicon nitride, silicon oxide, or silicon oxynitride may be used for the inorganic material. An organic insulating material, such as a polyacryl-based compound, a polyimide-based compound, a fluoro-based carbon compound such as Teflon, and a benzocyclobutene compound may be used for the organic material.

A gate electrode GE and a capacitor lower electrode LE are disposed on the first insulating film INS1. The gate electrode GE is formed to cover an area corresponding to the channel area of the active pattern ACT.

The gate electrode GE and the capacitor lower electrode LE may be formed of a metal. For example, the gate electrode GE may be formed of at least one of metals such as gold (Au), silver (Ag), aluminum (Al), molybdenum (Mo), chromium (Cr), titanium (Ti), nickel (Ni), neodymium (Nd), and copper (Cu), or an alloy of metals. In addition, the gate electrode GE may be formed of a single film, but is not limited thereto, and may be formed of a multilayer in which is two or more of the metals and alloy are stacked.

In an exemplary embodiment of the inventive concepts, other wires such as gate wires may be disposed on the same layer as the gate electrode GE and the capacitor lower electrode LE, and the other wires may be formed of the same material as the gate electrode GE and the capacitor lower electrode LE, which are not illustrated. Here, other wires such as the gate wires may be directly or indirectly connected to a part of transistors in each pixel, for example, the gate electrode GE.

A second insulating film INS2 is disposed on the gate electrode GE and the capacitor lower electrode LE. The second insulating film INS2 may be an inorganic insulating film formed of an inorganic material. Polysiloxane, silicon nitride, silicon oxide, silicon oxynitride, or the like may be used for the inorganic material.

A capacitor upper electrode UE is disposed on the second insulating film INS2. The capacitor upper electrode UE may be formed of metals. For example, the capacitor upper electrode UE may be formed of at least one of metals such as gold (Au), silver (Ag), aluminum (Al), molybdenum (Mo), chromium (Cr), titanium (Ti), nickel (Ni), neodymium (Nd), and copper (Cu), or an alloy of metals. In addition, the capacitor upper electrode UE may be formed of a single film, but is not limited thereto, and may be formed of a multilayer in which two or more of the metals and alloy are stacked.

The capacitor lower electrode LE and the capacitor upper electrode UE configure the capacitor Cst in a state where the second insulating film INS2 is interposed therebetween. In an exemplary embodiment of the inventive concepts, the capacitor Cst configured with the capacitor lower electrode LE and the capacitor upper electrode UE is described, but configuration of the capacitor Cst is not limited thereto.

A third insulating film INS3 is disposed on the capacitor upper electrode UE. The third insulating film INS3 may be an inorganic insulating film formed of an inorganic material. Polysiloxane, silicon nitride, silicon oxide, silicon oxynitride, or the like may be used for the inorganic material.

A source electrode SE and a drain electrode DE are disposed on the third insulating film INS3. The source electrode SE and the drain electrode DE are respectively in contact with the source area and the drain area of the active pattern ACT through contact holes formed in the third insulating film INS3, the second insulating film INS2, and the first insulating film INS1.

The source electrode SE and the drain electrode DE may be formed of metals. For example, each of the source electrode SE and the drain electrode DE may be formed of at least one of metals such as gold (Au), silver (Ag), aluminum (Al), molybdenum (Mo), chromium (Cr), titanium (Ti), nickel (Ni), neodymium (Nd), and copper (Cu), or an alloy of metals. In addition, each of the source electrode SE and the drain electrode DE may be formed of a single film, but is not limited thereto, and may be formed of a multilayer in which two or more of the metals and alloy are stacked.

In an exemplary embodiment of the inventive concepts, data lines or first power supply wires may be disposed on the same layer as the source electrode SE and the drain electrode DE, and as the same material as the source electrode SE and the drain electrode DE, which are not illustrated. Here, the data lines and the first power supply wires may be directly or indirectly connected to a part of transistors in each pixel PXL, for example, the source electrode SE and/or the drain electrode DE.

A passivation layer PSV may be disposed on the source electrode SE and the drain electrode DE. The passivation layer PSV may be an inorganic insulating film formed of an inorganic material, such as, polysiloxane, silicon nitride, silicon oxide, silicon oxynitride, or the like. The passivation layer PSV may be omitted.

A fourth insulating film INS4 may be disposed on the passivation layer PSV. If the passivation layer PSV is omitted, the fourth insulating film INS4 may be disposed on the third insulating film INS3.

The fourth insulating film INS4 may be an organic insulating film formed of an organic material. An organic insulating material, such as a polyacryl-based compound, a polyimide-based compound, a fluoro-based carbon compound such as Teflon, and a benzocyclobutene compound may be used for the organic material.

A connection pattern CNP may be disposed on the fourth insulating film INS4. The connection pattern CNP is connected to the drain electrode DE of a transistor through a contact hole passing through the fourth insulating film INS4 and the passivation layer PSV. The connection pattern CNP may be formed of at least one of metals such as gold (Au), silver (Ag), aluminum (Al), molybdenum (Mo), chromium (Cr), titanium (Ti), nickel (Ni), neodymium (Nd), and copper (Cu), or an alloy of metals. In addition, the connection pattern CNP may be formed of a single film, but is not limited thereto, and may be formed of a multilayer in which two or more of the metals and alloy are stacked.

In an exemplary embodiment of the inventive concepts, other wires such as dummy power supply wires may be disposed on the same layer as the connection pattern CNP and as the same material as the connection pattern CNP, which are not illustrated.

A fifth insulating film INS5 may be disposed on the connection pattern CNP. The fifth insulating film INS5 may be an organic insulating film formed of an organic material. An organic insulating material, such as a polyacryl-based compound, a polyimide-based compound, a fluoro-based carbon compound such as Teflon, or a benzocyclobutene compound may be used for the organic material.

A first electrode EL1 may be disposed on the fifth insulating film ISN5. The first electrode EL1 is connected to the connection pattern CNP through a contact hole passing through the fifth insulating film ISN5, and is connected to the drain electrode DE through a contact hole passing through the fourth insulating film INS4 and the passivation layer PSV, thereby, being connected to the transistor. Here, the first electrode EL1 may be used as one of an anode or a cathode in accordance with exemplary embodiments.

In an exemplary embodiment of the inventive concepts, the passivation layer PSV on which an organic insulating film formed of the fourth insulating film INS4 and the fifth insulating film ISN5 is disposed is described, but the organic insulating film may be disposed differently. For example, according to an exemplary embodiment of the inventive concepts, only one organic insulating film may be also disposed between the passivation layer PSV and the first electrode EL1. That is, according to an exemplary embodiment of the inventive concepts, only one organic insulating film may be disposed on the passivation layer PSV and the first electrode EL1 may be disposed on the organic insulating film. In this case, the connection pattern CNP may be omitted and the first electrode EL1 may be directly connected to the drain electrode DE through a contact hole formed in the organic insulating film. Hereinafter, it should be understood that, although an organic insulating film is formed of two layers of the fourth insulating film INS4 and the fifth insulating film ISN5 in an exemplary embodiment, the organic insulating film may include the fourth insulating film INS4 and the fifth insulating film ISN5 being separated from each other or not being separated.

The first electrode EL1 may be formed of a metal film such as Ag, Mg, Al, Pt, Pd, Au, Ni, Nd, Ir, Cr, or an alloy thereof, indium tin oxide (ITO), indium zinc oxide (IZO), zinc oxide (ZnO), indium tin zinc oxide (ITZO), and/or the like.

In an exemplary embodiment of the inventive concepts, the first electrode EL1 may be formed of one type of metal, but is not limited thereto, and may be formed of two or more types of metal, for example, an alloy of Ag and Mg.

The first electrode EL1 may be formed of a transparent conductive film, if an image is provided in a downward direction of the substrate SUB, and may be formed of a metal reflective film and/or a transparent conductive film, if the image is provided in an upward direction of the substrate SUB.

A pixel definition film PDL for partitioning a pixel area to correspond to each pixel PXL is disposed on the substrate SUB in which the first electrode EL1 and the like are formed. The pixel definition film PDL is an organic insulating film formed of an organic material. An organic insulating material, such as a polyacryl-based compound, a polyimide-based compound, a fluoro-based carbon compound such as Teflon, or a benzocyclobutene compound may be used for the organic material.

The pixel definition film PDL exposes an upper surface of the first electrode EL1 and protrudes from the substrate SUB along a circumference of the pixel PXL.

An organic light emitting layer OL may be disposed in the pixel area surrounded by the pixel definition film PDL.

The organic light emitting layer OL may contain a low molecular material or a high molecular material. The low molecular material may contain copper phthalocyanine (CuPc), N,N'-Di(naphthalene-1-yl)-N,N'-diphenyl-benzidine (NPB), tris-8-hydroxyquinoline aluminum (Alq3), or the like. Such materials may be formed by using a vacuum deposition method. The high molecular material may include PEDOT, Poly-Phenylenevinylene (PPV), Polyfluorene, or the like.

The organic light emitting layer OL may be configured by a single layer, but may be configured by multiple layers including various functional layers. If the organic light emitting layer OL is configured by the multiple layers, a structure in which a hole injection layer, a hole transport layer, an emission layer, an electron transport layer, an electron injection layer, and the like are independently stacked or are stacked as a composite structure may be provided. The organic light emitting layer OL may b e formed by using evaporation, screen printing, an ink jet printing method, a laser induced thermal imaging (LITI) method, or the like.

The organic light emitting layer OL is not limited thereto, and may have different structures. In addition, at least a part of the organic light emitting layer OL may be formed over a plurality of first electrodes EL1 in one piece, or may be separately formed to correspond to each of the plurality of first electrodes EL1.

A second electrode EL2 may be disposed on the organic light emitting layer OL. The second electrode EL2 may be disposed on each pixel PXL, but may be disposed to cover most of the display area DA, and may be shared by a plurality of pixels PXL.

The second electrode EL2 may be used as one of an anode or a cathode in accordance with exemplary embodiments, and the second electrode EL2 may be used as the cathode, if the first electrode EL1 is the anode, and the second electrode EL2 may be used as the anode if the first electrode EL1 is the cathode.

The second electrode EL2 may be formed of a metal film such as Ag, Mg, Al, Pt, Pd, Au, Ni, Nd, Ir, Cr, and/or a transparent conductive film such as indium tin oxide (ITO), indium zinc oxide (IZO), zinc oxide (ZnO), or indium tin zinc oxide (ITZO). In an exemplary embodiment of the inventive concepts, the second electrode EL2 may be formed of multiple layers of two or more layers including a metal thin film, or may be formed of triple layers of ITO/Ag/ITO.

The second electrode EL2 may be formed of a transparent conductive film, if an image is provided in a downward direction of the substrate SUB, and may be formed of a metal reflective film and/or a transparent conductive film, if the image is provided in an upward direction of the substrate SUB.

A seal film SL is disposed on the second electrode EL2. The seal film SL may be configured by a single layer, or may be configured by multiple layers. In an exemplary embodiment of the inventive concepts, the seal film SL may be configured by a first seal film SL1 to a third seal film SL3. The first seal film SL1 to the third seal film SL3 may be formed of an organic material and/or an inorganic material. The third seal film SL3 located at an outermost film may be formed of an inorganic material.

In an exemplary embodiment of the inventive concepts, the first seal film SL1 may be formed of an inorganic material, the second seal film SL2 may be formed of an organic material or an inorganic material, and the third seal film SL3 may be formed of an inorganic material. The inorganic material is less permeated by moisture or oxygen compared with the organic material, but is more vulnerable to crack due to low elasticity and low flexibility. It is possible to lessen or prevent the crack by forming the first seal film SL1 and the third seal film SL3 using an inorganic material, and forming the second seal film SL2 using an organic material. Here, if the second seal film SL2 is formed of an organic material, the second seal film SL2 may be fully covered by the third seal film SL3 such that an end portion thereof is not exposed.

In an exemplary embodiment of the inventive concepts, an organic insulating material, such as a polyacryl-based compound, a polyimide-based compound, a fluoro-based carbon compound such as Teflon, and a benzocyclobutene compound may be used for the organic material. An inorganic insulating material such as polysiloxane, silicon nitride, silicon oxide, or silicon oxynitride may be used for the inorganic material. If the second seal film SL2 is formed of an inorganic material instead of an organic material, various silicon-based insulating material, such as hexamethyldisiloxane (HMDSO), octamethylcyclotetrasiloxane (OMCTSO), tetramethyldisiloxane (TMDSO), or tetraethylorthosilicate (TEOS) may be used. In an exemplary embodiment of the inventive concepts, the organic light emitting layer OL may be easily damaged by moisture, oxygen, or the like from the outside. The seal film SL covers the organic light emitting layer OL to protect the organic light emitting layer OL. The seal film SL covers the display area DA and may extend to the outside of the display area DA.

An insulating film formed of an organic material may improve flexibility, elasticity, and the like, but is more easily permeated by moisture or oxygen, compared with an insulating film formed of an inorganic material. In an exemplary embodiment of the inventive concepts, in order to prevent moisture or oxygen from permeating through an insulating film formed of an organic material, an end portion of the insulating film formed of an organic material may be covered with an insulating film formed of an inorganic material to not be exposed. For example, the fourth insulating layer INS4, the fifth insulating film ISN5, and/or the pixel definition film PDL which are formed of organic materials may extend to only a part of the non-display area NDA, and may not cover the entire non-display area NDA. Particularly, the fourth insulating layer INS4, the fifth insulating film ISN5, and/or the pixel definition film PDL which are formed of organic materials may include a first opening OPN1 which is formed by removing a part of the display area DA along a circumference thereof.

In an exemplary embodiment of the inventive concepts, an upper surface of the pixel definition film PDL, and side surfaces of the fourth insulating layer INS4, the fifth insulating film ISN5, and/or the pixel definition film PDL which are exposed by a portion where the first opening OPN1 is provided are sealed with an insulating film including an inorganic material, for example, the seal film SL, and thereby, exposure to the outside is prevented. The layers or material of the seal film SL are not limited to the above examples, and may vary. For example, the seal film SL may include a plurality of organic material layers and a plurality of inorganic material layers which are alternately stacked.

Next, the non-display area NDA will be described. Hereinafter, the non-display area NDA will be described, and description which is made in advance will be omitted or will be simply made so as to avoid duplication of description.

In an exemplary embodiment of the inventive concepts, the non-display area NDA includes the wiring portion LP and the bent area BA which is in contact with the substrate SUB.

The wiring portion LP includes the data lines DL and connects a drive unit including the data drive unit to the pixels PXL.

The data lines DL according to an exemplary embodiment of the inventive concepts may connect the pixels PXL to the drive unit, and may extend substantially in the second direction DR2 from the pixels PXL. The data lines DL may extend to the pad area PA which is an end portion of the additional display area ADA in the second direction DR2. The pad area PA includes the data drive unit D-IC including a plurality of thin film transistors, and the contact electrodes CTE may be provided in the end portions of the wires connected to the data drive unit D-IC. The pixels PXL may be connected to the drive unit realized by a printed circuit board or the like through the contact electrodes CTE connected to the wires.

The data lines DL includes first data lines DL1 and second data lines DL2.

The first data lines DL1 may include a plurality of sub wires connected to each other.

The second data lines DL2 may also include a plurality of sub wires connected to each other. FIG. 5 illustrates only a second fanout line DL2b, a second link wire DL2c, and a second connection wire DL2d, among the data lines DL for the sake of convenience of description. The data lines DL will be described below.

The buffer layer BF is disposed on the non-display area NDA of the substrate SUB.

The first insulating film INS1 to the fourth insulating layer INS4 are sequentially disposed on the buffer layer BF.

For example, a second opening OPN2 is formed in the insulating films provided in the bent area BA. The bent area BA is an area where the substrate SUB is bent. That is, a portion corresponding to the bent area BA is removed from the buffer layer BF, the first insulating film INS1, the second insulating film INS2, and the third insulating film INS3, and thereby forming the second opening OPN2, but exemplary embodiments of the inventive concepts are not limited thereto. According to an exemplary embodiment, a portion corresponding to the bent area BA may not be removed from a part of the buffer layer BF, the first insulating film INS1, the second insulating film INS2, and the third insulating film INS3. According to an exemplary embodiment, a portion corresponding to the bent area BA may not be removed from the buffer layer BF, and a part corresponding to the bent area BA may be removed from the rest of the insulating film, that is, the first insulating film INS1, the second insulating film INS2, and the third insulating film INS3, and thereby, the second opening OPN2 is formed therein.

Accordingly, the second opening OPN2 and the bent area BA may overlap. An area of the second opening OPN2 may be larger than an area of the bent area BA. In an exemplary embodiment of the inventive concepts, a width of the second opening OPN2 is illustrated to be larger than a width of the bent area BA, but this is for the sake of convenience of description, and the width of the second opening OPN2 may be equal to the width of the bent area BA or may be different from the width of the bent area BA.

Referring to FIG. 5, the buffer layer BF, the first insulating film INS1, the second insulating film INS2, and the third insulating film INS3 are arranged in a straight line such that inner side surfaces thereof coincide with each other, but exemplary embodiments of the inventive concepts are not limited thereto. For example, the second opening OPN2 of the third insulating film INS3 may be wider than the second opening OPN2 of the buffer layer BF. In an exemplary embodiment of the inventive concepts, the second opening OPN2 of the buffer layer BF may be defined as the narrowest followed by the second opening OPN2 of the first insulating film INS1, the second opening OPN2 of the second insulating film INS2, and the second opening OPN2 of the third insulating film INS3.

A bent portion insulating film INS_B is disposed in the second opening OPN2. The bent portion insulating film INS_B may fill at least a part of the second opening OPN2, or as illustrated in FIG. 5, the entire second opening OPN2 may be filled with the bent portion insulating film INS_B, but exemplary embodiments of the inventive concept are not limited thereto. For example, in an exemplary embodiment of the inventive concepts, the bent portion insulating film INS_B may fill the second opening OPN2, and at the same time, may extend toward an area adjacent to the second opening OPN2. For example, the bent portion insulating film INS_B may cover a part of an upper portion of the third insulating film INS3 corresponding to the first and/or second flat areas FA1 and FA2.

The bent portion insulating film INS_B may be an organic insulating film formed of an organic material. An organic insulating material, such as a polyacryl-based compound, a polyimide-based compound, a fluoro-based carbon compound such as Teflon, and a benzocyclobutene compound may be used for the organic material.

As described above, the display device is not bent in FIG. 5, but the display device according to an exemplary embodiment of the inventive concepts may be bent in the bent area BA. The display device according to an exemplary embodiment of the inventive concepts may be manufactured in a flat state, and may be bent thereafter.

In an exemplary embodiment of the inventive concepts, the bent area BA may be provided in a portion where an inorganic insulating film is removed, but the bent area BA may coincide with the portion where the inorganic insulating film is removed. For example, the bent area BA may substantially correspond to the portion where the inorganic insulating film is removed, but may be the same as, wider than, or narrower than the portion where the inorganic insulating film is removed, if necessary. In addition, in an exemplary embodiment of the inventive concepts, the bent area BA may be provided only in the non-display area NDA, but is not limited thereto. For example, the bent area BA may also be provided over the non-display area NDA and the display area DA, but may also be provided within the display area DA.

The passivation layer PSV may be disposed on the substrate SUB. The passivation layer PSV may be an inorganic insulating film. The passivation layer PSV may not be disposed in an area corresponding to the bent area BA in the same manner as in the inorganic insulating films (the buffer layer BF), the first insulating film INS1, the second insulating film INS2, and/or the third insulating film INS3 which are described above. In addition, the passivation layer PSV exposes a part of an upper portion of a lower contact electrode CTEa.

The fourth insulating layer INS4 may be disposed on the passivation layer PSV. The fifth insulating film ISN5 may be disposed on the fourth insulating layer INS4. The first opening OPN1 is formed in the fourth insulating layer INS4 and the fifth insulating film ISN5 along a circumference of the display area DA by removing a part of the fourth insulating layer INS4 and the fifth insulating film ISN5. Accordingly, the fourth insulating layer INS4 and the fifth insulating film ISN5 do not continuously extend from the display area DA to the non-display area NDA.

As described above, the side surfaces of the fourth insulating layer INS4 and the fifth insulating film ISN5 which are disposed in the display area DA are covered with the seal film SL. However, the upper surface of the fifth insulating film ISN5 and the side surfaces of the fifth insulating film ISN5 and the fourth insulating layer INS4 which are disposed in the non-display area NDA need not be entirely covered, and at least a part may be exposed.

The data drive unit D-IC may be mounted in the pad area PA, and the data drive unit D-IC may include a plurality of thin film transistors. The thin film transistors in the data drive unit D-IC may be formed together when the thin film transistors of the pixel unit are formed.

The lower contact electrode CTEa may be disposed on the third insulating film INS3 and an upper contact electrode CTEb may be disposed on the lower contact electrode CTEa. The upper contact electrode CTEb may be formed of the same material as and in the same process as the connection pattern CNP of the display area DA. The lower contact electrode CTEa and the upper contact electrode CTEb may configure the contact electrode CTE, and wires may be corresponding to a flexible printed circuit board or the like through the contact electrodes CTE.

In an exemplary embodiment of the inventive concepts, the first and second data lines DL1 and DL2 are respectively disposed in different layers in the fanout area FTA and the pad area PA, and thus, resistance values of each data line DL and deviation with respect to delay of a signal may be reduced or minimized. Description thereon will be made as follows. In the following drawings, a part of the configuration elements is omitted for the sake of convenience of description, and the omitted configuration elements are described in the aforementioned embodiments.

Figure 7A:
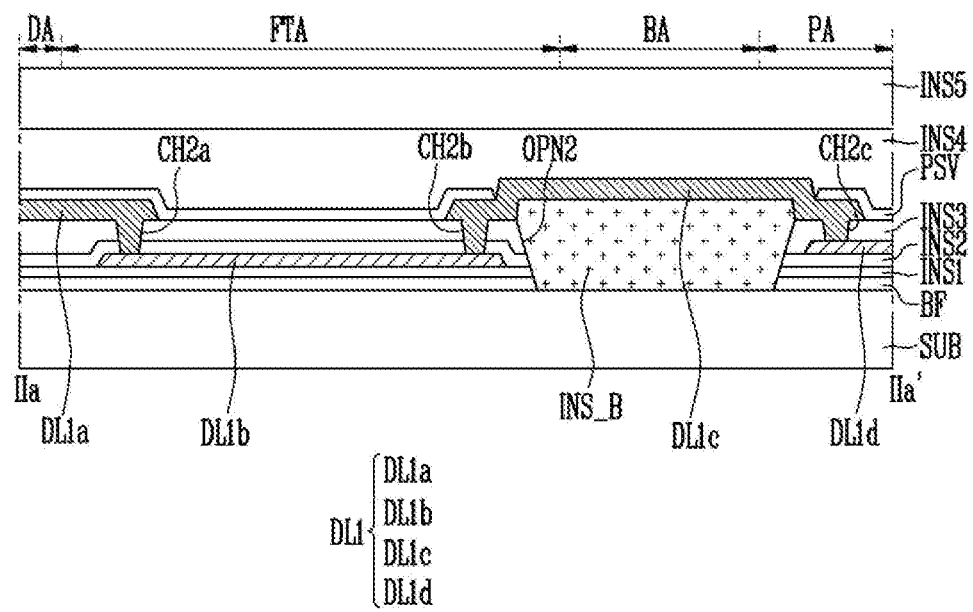
FIG. 7A is a cross sectional view taken along a line IIa-IIa' of FIG. 6.
Figure 7B:
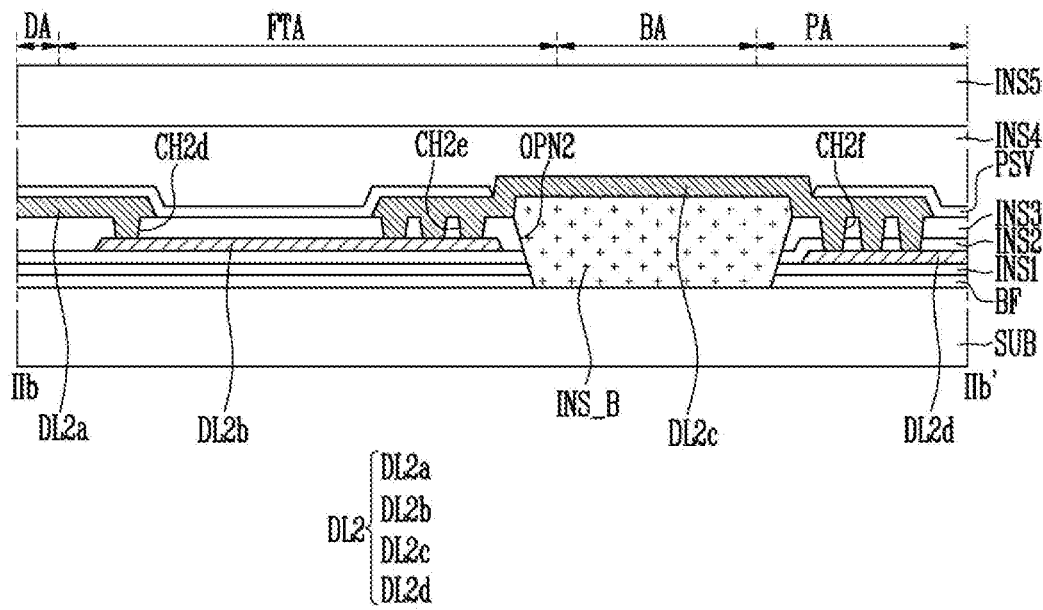
FIG. 7B is a cross sectional view taken along a line IIb-IIb' of FIG. 6.
Figure 7C:
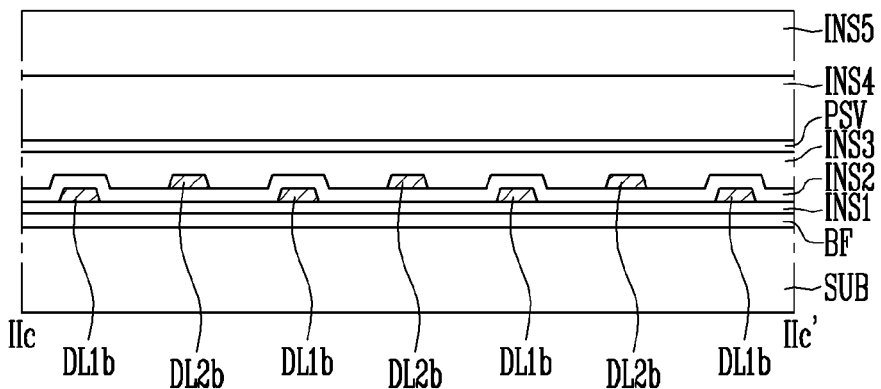
FIG. 7C is a cross sectional view taken along a line IIc-IIc' of FIG. 6.
Figure 7D:
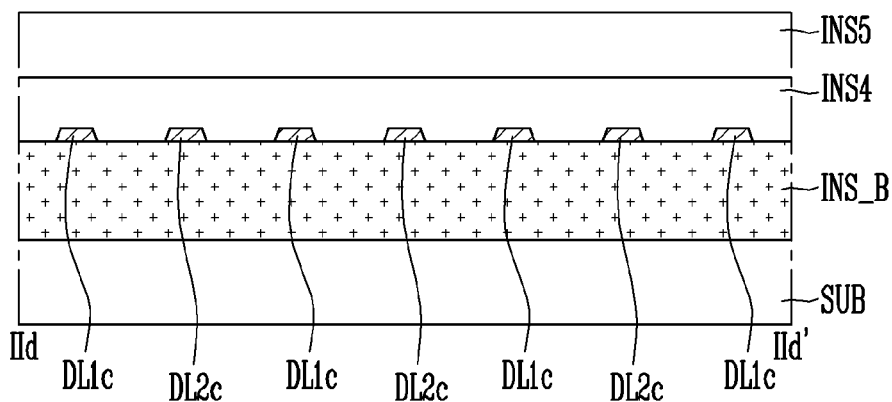
FIG. 7D is a cross sectional view taken along a line IId-IId' of FIG. 6.
Figure 7E:
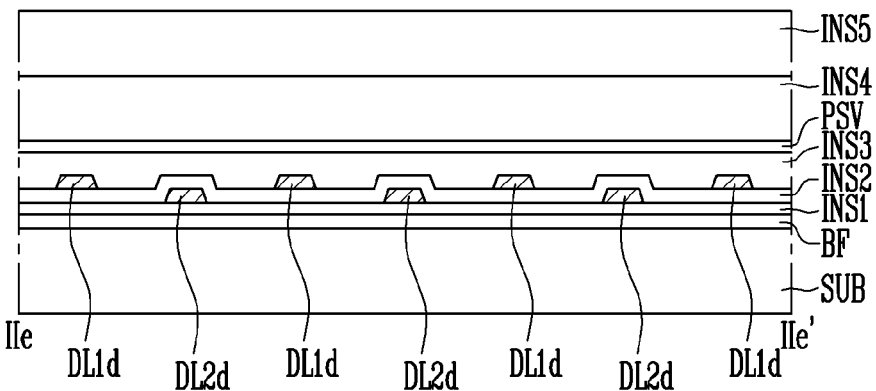
FIG. 7E is a cross sectional view taken along a line IIe-IIe' of FIG. 6.

FIG. 6 illustrates data lines of the display device according to an exemplary embodiment of the inventive concepts and is a plan view illustrating a portion corresponding to A1 of FIG. 2. FIG. 7A is a cross sectional view taken along a line IIa-IIa' of FIG. 6, FIG. 7B is a cross sectional view taken along a line IIb-IIb' of FIG. 6, FIG. 7C is a cross sectional view taken along a line IIc-IIc' of FIG. 6, FIG. 7D is a cross sectional view taken along a line IId-IId' of FIG. 6, and FIG. 7E is a cross sectional view taken along a line IIe-IIe' of FIG. 6.

Referring to FIG. 6 and FIG. 7A to FIG. 7E, the data lines DL include the first data lines DL1 connected to a first pixel column and the second data lines DL2 connected to a second pixel column. The first pixel column is connected to first pixels of a first color. The second pixel column is connected to second pixels of a second color and third pixels of a third color. In an exemplary embodiment of the inventive concepts, the first color may be green, and accordingly, the first data line DL1 may be connected to green pixels. In an exemplary embodiment of the inventive concepts, the second color may be red and the third color may be blue, and accordingly, the second data line DL2 may be connected to red pixels and blue pixels.

Hereinafter, the first data line DL1 and the second data line DL2 on a planar view will be described with reference to FIG. 6, and thereafter, the first data line DL1 and the second data line DL2 on a cross section will be described with reference to FIG. 7A to FIG. 7E.

Referring to FIG. 6, a plurality of the first data lines DL1 and a plurality of the second data lines DL2 are provided and are alternately arranged in the first direction DR1.

The first data lines DL1 and the second data lines DL2 extend in the second direction DR2 in the display area DA. The first data lines DL1 and the second data lines DL2 extend substantially in the second direction DR2 in the fanout area FTA, but a gap between the adjacent data lines DL is gradually narrowed in the second direction DR2. The first data lines DL1 and the second data lines DL2 extend in the second direction DR2 in the bent area BA and the pad area PA. Accordingly, a gap between the first data line DL1 and the second data line DL2 adjacent to each other is narrower in the bent area BA and the pad area PA than in the display area DA.

The first data line DL1 may include a plurality of sub lines connected to each other. The sub lines may include first pixel unit data line DL1a disposed in the display area DA, first fanout line DL1b disposed in the fanout area FTA, first link wire DL1c disposed in the bent area BA, and first connection wire DL1d disposed in the pad area PA. The first pixel unit data line DL1a is connected to the first fanout lines DL1b, the first fanout line DL1b is connected to the first link wire DL1c, the first link wire DL is connected to the first connection wire DL1d. While not illustrated, the first connection wire DL1d is connected to the data drive unit and the contact electrode.

An end portion of the first pixel unit data line DL1a and an end portion of the first fanout line DL1b overlap each other, and are connected to each other through a first contact hole CH2a. A portion where the first pixel unit data line DL1a overlaps the first fanout line DL1b may be disposed in the fanout area FTA. However, the portion where the first pixel unit data line DL1a overlaps the first fanout line DL1b is not limited thereto, and at least a part thereof may be provided within the display area DA.

An end portion of the first fanout line DL1b and an end portion of the first link wire DL1c are connected to each other through a second contact hole CH2b. A portion where the first fanout line DL1*b* overlaps the first link wire DL1*c* may be disposed in the fanout area FTA. However, the portion where the first fanout line DL1*b* overlaps the first link wire DL1*c* is not limited thereto, and at least a part thereof may be disposed within the bent area BA.

An end portion of the first link wire DL1*c* and an end portion of the first connection wire DL1*d* are connected to each other through a third contact hole CH2*c*. A portion where the first link wire DL1*c* overlaps the first connection wire DL1*d* may be disposed in the pad area PA. However, the portion where the first link wire DL1*c* overlaps the first connection wire DL1*d* is not limited thereto, and at least a part thereof may be disposed within the bent area BA.

The second data line DL2 also may include a plurality of sub wires connected to each other. The sub lines may include second pixel unit data line DL2*a* disposed in the display area DA, second fanout line DL2*b* disposed in the fanout area FTA, second link wire DL2*c* disposed in the bent area BA, and second connection wire DL2*d* disposed in the pad area PA. The second pixel unit data line DL2*a* is connected to the second fanout lines DL2*b*, the second fanout line DL2*b* is connected to the second link wire DL2*c*, the second link wire DL2*c* is connected to the second connection wire DL2*d*. While not illustrated, the second connection wire DL2*d* is connected to the data drive unit and the contact electrode.

An end portion of the second pixel unit data line DL2*a* and an end portion of the second fanout line DL2*b* overlap each other, and are connected to each other through a fourth contact hole CH2*d*. A portion where the second pixel unit data line DL2*a* overlaps the second fanout line DL2*b* may be disposed in the fanout area FTA. However, the portion where the second pixel unit data line DL2*a* overlaps the second fanout line DL2*b* is not limited thereto, and at least a part thereof may be disposed within the display area DA.

An end portion of the second fanout line DL2*b* and an end portion of the second link wire DL2*c* are connected to each other through a fifth contact hole CH2*e*. A portion where the second fanout line DL2*b* overlaps the second link wire DL2*c* may be disposed in the fanout area FTA. However, the portion where the second fanout line DL2*b* overlaps the second link wire DL2*c* is not limited thereto, and at least a part thereof may be provided within the bent area BA.

An end portion of the second link wire DL2*c* and an end portion of the second connection wire DL2*d* are connected to each other through a sixth contact hole CH2*f*. A portion where the second link wire DL2*c* overlaps the second connection wire DL2*d* may be disposed in the pad area PA. However, the portion where the second link wire DL2*c* overlaps the second connection wire DL2*d* is not limited thereto, and at least a part thereof may be disposed within the bent area BA.

Referring to FIG. 7A, the buffer layer BF, the first insulating film INS1 to the third insulating film INS3, the passivation layer PSV, the fourth insulating layer INS4, and the fifth insulating film ISN5 are stacked on the display area DA and the non-display area NDA. The bent portion insulating film INS_B, the fourth insulating layer INS4, and the fifth insulating film ISN5 are stacked on the substrate of the bent area BA in the non-display area NDA.

The first data line DL1 is disposed on the third insulating film INS3 in the display area DA, disposed on the first insulating film INS1 in the fanout area FTA, disposed on the bent portion insulating film INS_B in the bent area BA, and disposed on the second insulating film INS2 in the pad area PA. In detail, the first pixel unit data line DL1*a* is disposed on the third insulating film INS3 in the display area DA, the first fanout line DL1*b* is disposed on the first insulating film INS1 in the fanout area FTA, the first link wire DL1*c* is disposed on the bent portion insulating film INS_B in the bent area BA, and the first connection wire DL1*d* is disposed on the second insulating film INS2 in the pad area PA.

The first and second contact holes CH2*a* and CH2*b* which expose a part of an upper surface of the first fanout line DL1*b* are provided in the second and third insulating films INS2 and INS3. The third contact hole CH2*c* which exposes a part of the first connection wire DL1*d* is provided in the third insulating film INS3. The first pixel unit data line DL1*a* and the first link wire DL are connected to the first fanout line DL1*b* and the first link wire DL through the first to third contact holes CH2*a*, CH2*b*, and CH2*c*.

Referring to FIG. 7B the buffer layer BF, the first insulating film INS1 to the third insulating film INS3, the passivation layer PSV, the fourth insulating layer INS4, and the fifth insulating film ISN5 are stacked on a part of the display area DA and the non-display area NDA. The bent portion insulating film INS_B, the fourth insulating layer INS4, and the fifth insulating film ISN5 are stacked on the bent area BA in the non-display area NDA.

The second data line DL2 is disposed on the third insulating film INS3 in the display area DA, disposed on the second insulating film INS2 in the fanout area FTA, disposed on the bent portion insulating film INS_B in the bent area BA, and disposed on the first insulating film INS1 in the pad area PA. In detail, the second pixel unit data line DL2*a* is disposed on the third insulating film INS3 in the display area DA, the second fanout line DL2*b* is disposed on the second insulating film INS2 in the fanout area FTA, the second link wire DL2*c* is disposed on the bent portion insulating film INS_B in the bent area BA, and the second connection wire DL2*d* is disposed on the first insulating film INS1 in the pad area PA.

The fourth and fifth contact holes CH2*d* and CH2*e* which expose a part of an upper surface of the second fanout line DL2*b* are provided in the third insulating film INS3. The sixth contact hole CH2*e* which exposes a part of the second connection wire DL2*d* is provided in the second and third insulating films INS2 and INS3. The second pixel unit data line DL2*a* and the second fanout line DL2*b* are connected to each other through the fourth contact hole CH2*d*. The second fanout line DL2*b* and the second link wire DL2*c* are connected to each other through the fifth contact hole CH2*e*. The second link wire DL2*c* and the second connection wire DL2*d* are connected to each other through the sixth contact hole CH2*f*.

FIG. 7A and FIG. 7B illustrate that the bent portion insulating film INS_B is disposed only in a part corresponding to the second opening OPN2, but the inventive concepts is not limited thereto. In an exemplary embodiment of the inventive concepts, the bent portion insulating film INS_B may fill the second opening OPN2, and at the same time, may extend toward an area adjacent to the second opening OPN2.

For example, while not illustrated, the bent portion insulating film INS_B may cover a part of an upper portion of the third insulating film INS3, or may also extend to a portion where contact holes (at least one of the second contact hole CH2*b*, the third contact hole CH2*c*, the fifth contact hole CH2*e*, and the sixth contact hole CH2*f*) between wires adjacent to the first and second link wires DL1*c* and DL2*c* are formed.

Referring to FIG. 7C, the first fanout lines DL1*b* of the first data lines DL1 and the second fanout lines DL2*b* of the second data lines DL2 are respectively provided in different layers from each other, and are alternately disposed on a planar view. The first fanout lines DL1*b* are arranged on the second insulating film INS2, and the second fanout lines DL2*b* are arranged on the third insulating film INS3.

As the first fanout line DL1*b* and the second fanout line DL2*b* have the aforementioned structures, a wide gap between the adjacent data lines DL may be secured. If the data lines DL are formed on one layer, the gap between the adjacent data lines DL is narrower, but if the data lines DL are alternately disposed on two layers different from each other, a gap between the adjacent data lines DL within one layer is widened. Accordingly, a degree of freedom for designing the data lines DL increases.

Referring to FIG. 7D, the first link wires DL of the first data lines DL1 and the second link wires DL2*c* of the second data lines DL2 are disposed on the same layer. The first link wire DL1*c* and the second link wires DL2*c* may be disposed on the bent portion insulating film INS_B. The first link wires DL1*c* of the first data lines DL1 and the second link wires DL2*c* of the second data lines DL2 are alternately disposed on a planar view.

According to the display device having the aforementioned structure, a difference between resistance values of the data lines and a difference between delay values of signals may be reduced.

A width or a thickness of each wire of the display device changes depending on a position and a method of forming the wire, and thereby, resistance values may differ from each other. Particularly, if a display area and non-display area are formed in the same process, the width or the thickness of the wire which is a target is formed in accordance with the display area, and thereby, a width or a thickness of the wire in the non-display area may deviate from an original width or an original thickness. This is because the width or the thickness of the wire changes depending on process conditions at the time of forming the wire, density of the wire, and the like, it is difficult to predict a correct width or a correct thickness of the wire which is actually formed in the non-display area. When the wires are formed in the non-display area, the wires may have different widths or thicknesses depending on whether they are formed on a first insulating film or a second insulating film, and as a result, the wire formed on the first insulating film may have different resistance value from the wire formed on the second insulating film. Accordingly, if a predetermined data line is formed only on the first insulating film and another data line is formed only on the second insulating film, a resistance value difference between the two data lines may be higher. The resistance value difference between the wires depending on the positions causes a difference in charge amount of the data signals which are applied to the data lines and delay of the signals, and as a result, may cause stain in a vertical line of the pixel area or color deviation failure in each area.

However, the display device according to an exemplary embodiment of the inventive concepts simultaneously includes portions where one wire is disposed on different layers, and thus, resistance deviation between the wires may be reduced or minimized. As in the aforementioned exemplary embodiment, the first data line may be disposed on the first insulating film in the fanout area, and may be disposed on the second insulating film in the pad area. The second data line may be disposed on the second insulating film in the fanout area, and may be disposed on the first insulating film in the pad area. The resistance value deviation may be significantly reduced compared with the related art in which the first data line and the second wire are formed only on one insulating film.

It is also possible to additionally reduce the resistance value difference between two data lines by differently setting a contact structure in which each portion of the first data line and the second data line is connected in the non-display area, in an exemplary embodiment of the inventive concepts. For example, the contact structure with relatively small resistance may be formed in the wire whose entire resistance is determined to be large, among the first data line and the second data line. In the aforementioned exemplary embodiment, where a delay value of the second data line is larger is described, and the number of contact holes provided in the second data line may be larger than the number of contact holes provided in the first data line. Thus, contact resistance of the second data line may be smaller than contact resistance of the first data line. Particularly, the contact resistance where at least a part of the insulating films is formed of an organic film may be larger than the contact resistance where at least the part of the insulating films is formed of an inorganic film. However, by providing a plurality of contact holes, a contact area of a lower wire and an upper wire is widened, and thereby, the contact resistance may decrease. Accordingly, resistance of the second data line may decrease, and thereby, it is possible to additionally compensate for the delay of a signal in the data line.

In an exemplary embodiment of the inventive concepts, setting different contact structure (for example, the number of contact holes) in which each portion of the first data line and the second data line is connected is described, but the inventive concepts is not limited thereto, and the number of contact holes or areas of the contact holes provided in the first data line and the second data line may be the same.

According to the display device having the aforementioned structure, the resistance value deviation between the first data line and the second data line, and delay deviation between data signals may be reduced, and thereby, defects which can occur due to the delay deviation between data signals, for example, stain of a vertical line or color deviation defects may be reduced. In the contact structure of the data lines according to the aforementioned exemplary embodiment, resistance between the wires connected to each other may be reduced by setting different number of contact holes, and thus, it is possible to more easily remove or reduce the resistance deviation.

Following Table 1 illustrates resistances of wires of the display device according to the related art and the display device according to an exemplary embodiment of the inventive concepts where positions of the data lines differ from each other. Comparative example 1 relates to the display device according to the related art, and corresponds to a case where the first data line is formed only on the first insulating film in the fanout area and the pad area and the second data line is formed only on the second insulating film in the fanout area and the pad area. Exemplary embodiment 1 relates to the display device according to an exemplary embodiment of the inventive concepts, and shows a case where the first data line is formed on the first insulating film in the fanout area and formed on the second insulating film in the pad area, and the second data line is formed on the second insulating film in the fanout area and formed on the first insulating film in the pad area. In comparative example 1 and exemplary embodiment 1, all conditions except for positions of the wires are maintained in the same manner.

TABLE 1

| wire type area | Comparative example 1 | | | | Exemplary embodiment 1 | | | |
|---|---|---|---|---|---|---|---|---|
| | first data line | | second data line | | first data line | | second data line | |
| | fanout area | pad area | fanout area | pad area | fanout area | pad area | fanout area | pad area |
| wire position | on first insulating film | on first insulating film | on second insulating film | on second insulating film | on first insulating film | on second insulating film | on first insulating film | on second insulating film |
| difference between designed width and actually formed width of wire | 0.38 μm | 0.38 μm | 0.54 μm | 0.54 μm | 0.38 μm | 0.54 μm | 0.54 μm | 0.38 μm |
| wire resistance | 4587 Ω | | 4899 Ω | | 4741 Ω | | 4746 Ω | |

Referring to Table 1, a difference between a designed width and an actually formed width of the wire on the first insulating film is 0.38 μm, but a difference between a designed width and an actually formed width of the wire on the second insulating film is 0.54 μm. This may show that, even in a case of the same material and the same process, the wires may have different widths from each other depending on the layers on which the wires are formed.

In comparative example 1, a resistance difference between the first data line and the second data line is as high as 312Ω, but in exemplary embodiment 1, the resistance difference between the first data line and the second data line is only 5Ω. This may show that resistance deviation between two wires may be significantly reduced in exemplary embodiment 1 rather than comparative example 1.

In the same manner as Table 1, Table 2 illustrates resistances of wires of the display device according to the related art and the display device according to an exemplary embodiment of the inventive concepts where positions of the data lines differ from each other. Comparative example 2 relates to the display device according to the related art, and exemplary embodiment 2 relates to the display device according to an exemplary embodiment of the inventive concepts. In comparative example 2 and exemplary embodiment 2, all conditions except for positions of the wires are maintained in the same manner.

TABLE 2

| wire type area | Comparative example 2 | | | | Exemplary embodiment 2 | | | |
|---|---|---|---|---|---|---|---|---|
| | first data line | | second data line | | first data line | | second data line | |
| | fanout area | pad area | fanout area | pad area | fanout area | pad area | fanout area | pad area |
| wire position | on first insulating film | on first insulating film | on second insulating film | on second insulating film | on first insulating film | on second insulating film | on first insulating film | on second insulating film |
| difference between designed width and actually formed width of wire | 0.38 μm | 0.38 μm | 0.54 μm | 0.54 μm | 0.38 μm | 0.54 μm | 0.54 μm | 0.38 μm |
| wire resistance | 4564 Ω | | 4778 Ω | | 4637 Ω | | 4707 Ω | |

Referring to Table 2, a difference between a designed width and an actually formed width of the wire on the first insulating film is 0.38 μm, but a difference between a designed width and an actually formed width of the wire on the second insulating film is 0.54 μm. This may show that, even in a case of the same material and the same process, the wires have different widths from each other depending on the layers on which the wires are formed.

In comparative example 2, a resistance difference between the first data line and the second data line is as high as 214Ω, but in embodiment 2, the resistance difference between the first data line and the second data line is only 70Ω. This may show that resistance deviation between two wires may be significantly reduced in exemplary embodiment 2 rather than comparative example 2.

According to an exemplary embodiment of the inventive concepts, the structure of the data line may vary within a range where resistances between the data lines match. In the following exemplary embodiment, different points from the aforementioned exemplary embodiment will be mainly described for the sake of duplication of description.

Figure 8:
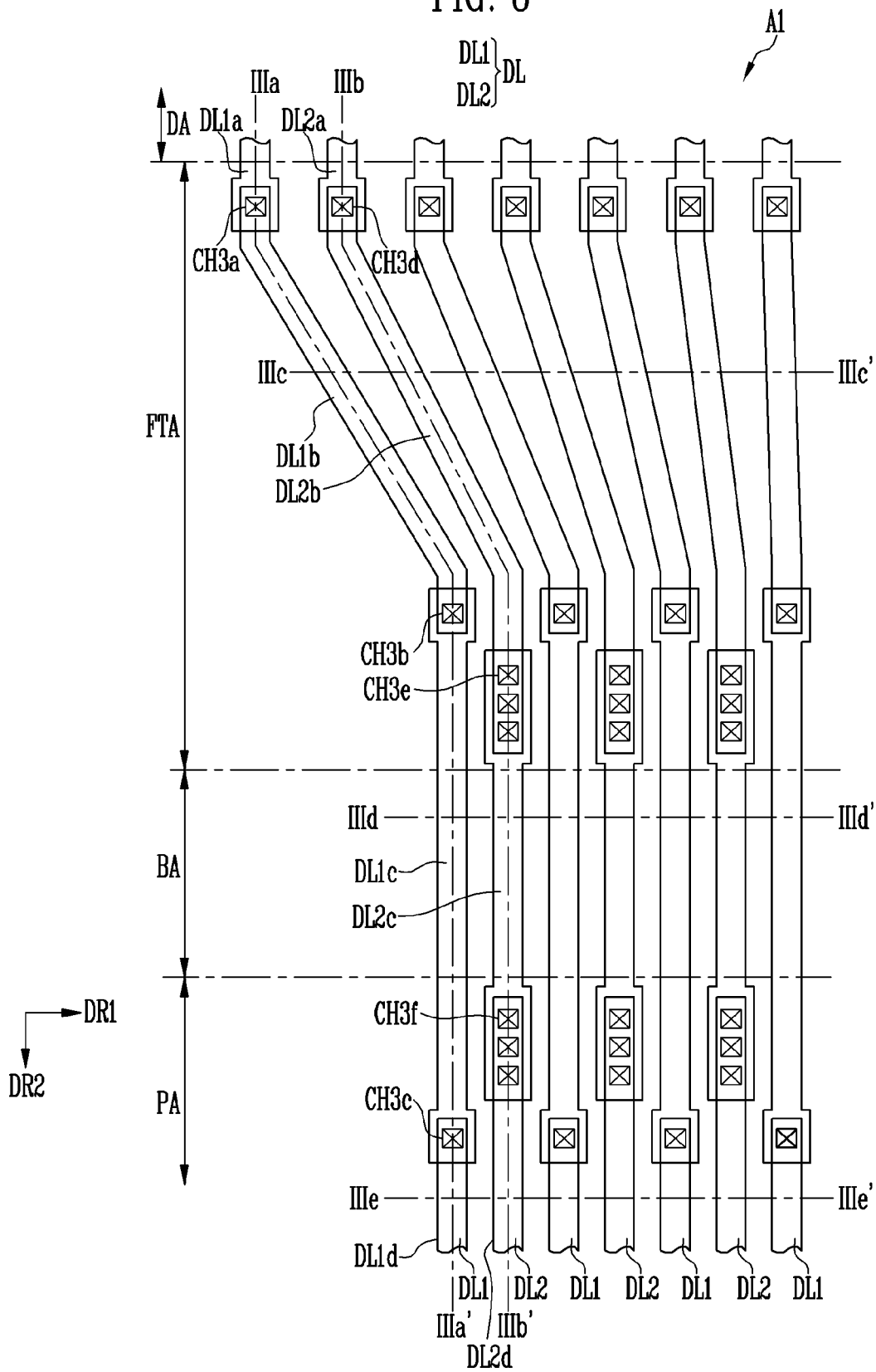
FIG. 8 illustrates the data lines of the display device according to an exemplary embodiment of the inventive concepts, and is a plan view illustrating the portion corresponding to A1 of FIG. 2.

FIG. 8 illustrates the data lines of the display device according to the embodiment of the inventive concepts, and is a plan view illustrating the portion corresponding to A1 of FIG. 2.

Figure 9A:
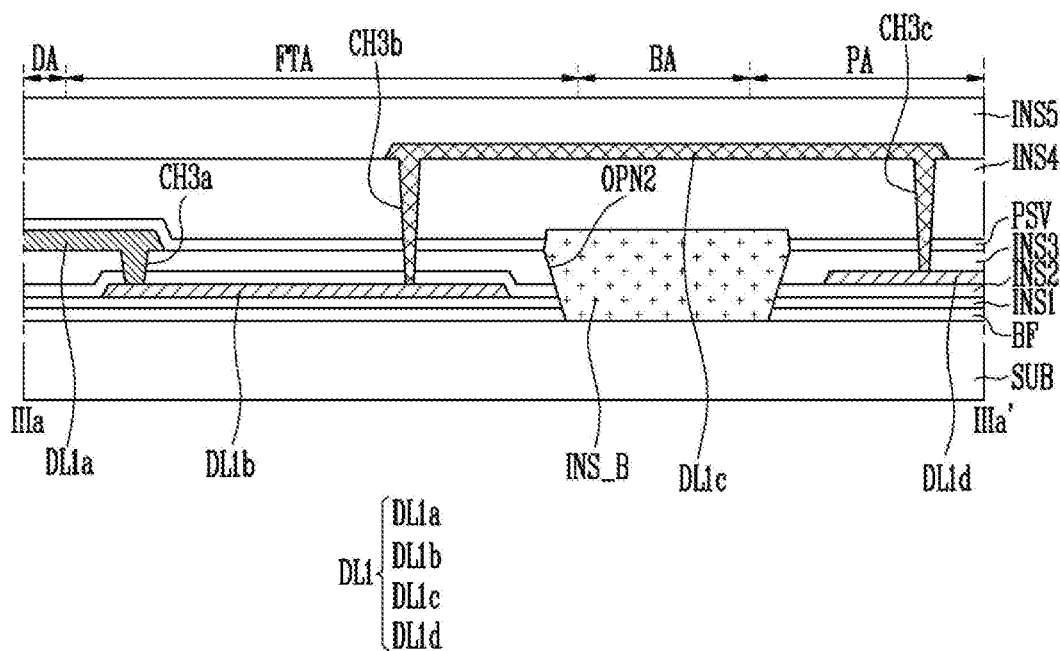
FIG. 9A is a cross sectional view taken along a line IIIa-IIIa' of FIG. 8.
Figure 9B:
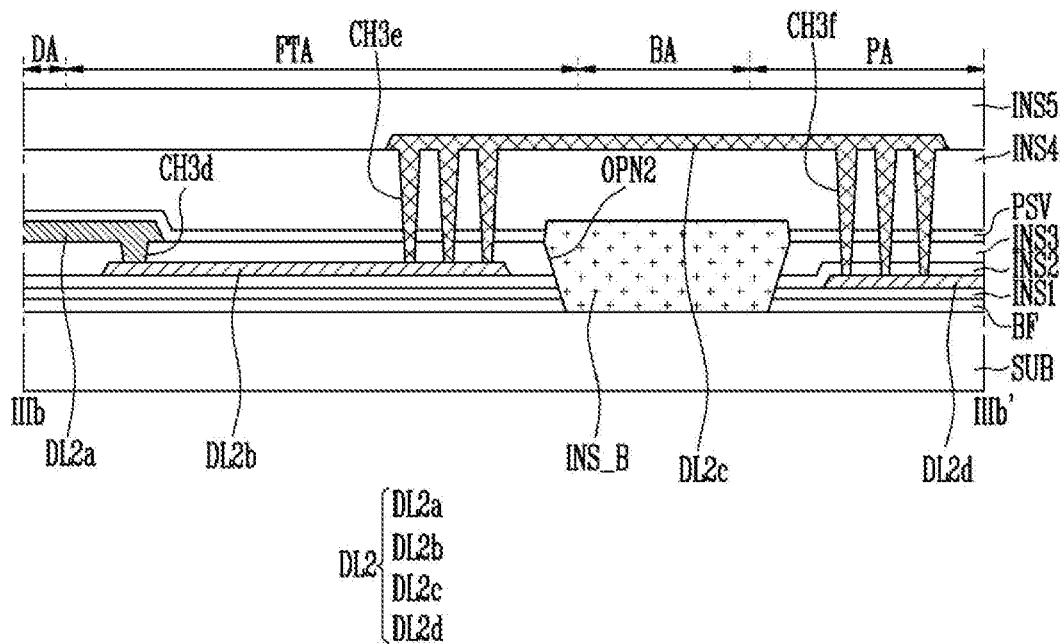
FIG. 9B is a cross sectional view taken along a line IIIb-IIIb' of FIG. 8.
Figure 9C:
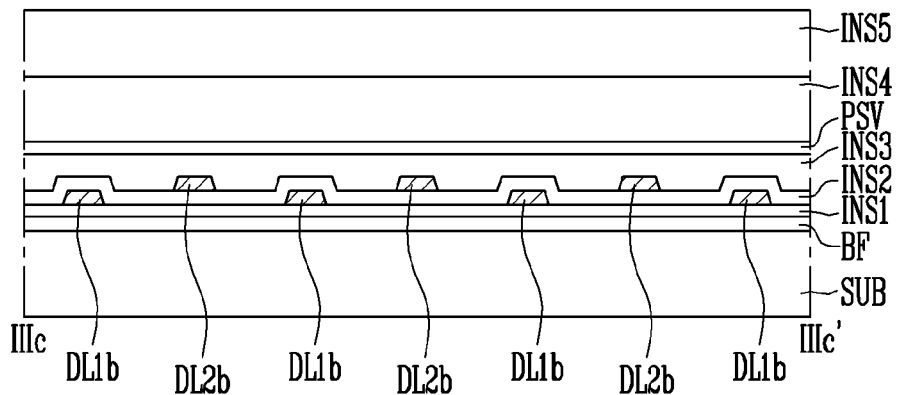
FIG. 9C is a cross sectional view taken along a line IIIc-IIIc' of FIG. 8.
Figure 9D:
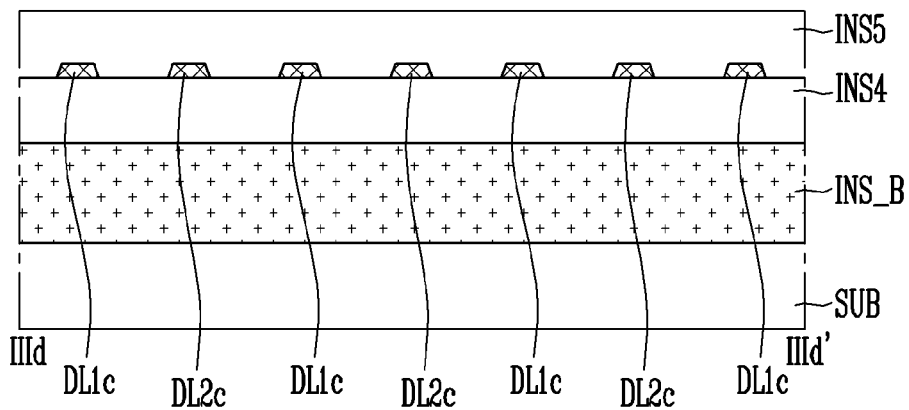
FIG. 9D is a cross sectional view taken along a line IIId-IIId' of FIG. 8.
Figure 9E:
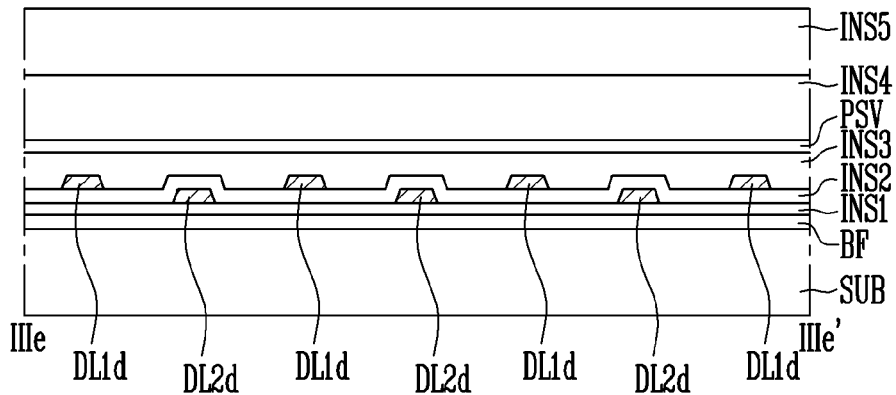
FIG. 9E is a cross sectional view taken along a line of FIG. 8.

FIG. 9A is a cross sectional view taken along a line of FIG. 8, FIG. 9B is a cross sectional view taken along a line IIIb-IIIb' of FIG. 8, FIG. 9C is a cross sectional view taken along a line IIIc-IIIc' of FIG. 8, FIG. 9D is a cross sectional view taken along a line IIId-IIId' of FIG. 8, and FIG. 9E is a cross sectional view taken along a line IIIe-IIIe' of FIG. 8.

Referring to FIG. 8 and FIG. 9A to FIG. 9E, the first data line and the second data line may be disposed on different layers from the layers described in the bent area.

The first data lines DL1 is disposed on the third insulating film INS3 in the display area DA, disposed on the first insulating film INS1 in the fanout area FTA, disposed on the fourth insulating layer INS4 in the bent area BA, and disposed on the second insulating film INS2 in the pad area PA. In detail, the first pixel unit data line DL1a is disposed on the third insulating film INS3 in the display area DA, the first fanout line DL1b is provided on the first insulating film INS1 in the fanout area FTA, the first link wire DL1c is disposed on the fourth insulating layer INS4 in the bent area BA, and the first connection wire DL1d is disposed on the second insulating film INS2 in the pad area PA.

The first pixel unit data line DL1a is connected to the first fanout line DL1b through a first contact hole CH3a, the first fanout line DL1b is connected to the first link wire DL1c through a second contact hole CH3b, and the first link wire DL1c is connected to the first connection wire DL1d through a third contact hole CH3c.

The second data line DL2 is disposed on the third insulating film INS3 in the display area DA, disposed on the second insulating film INS2 in the fanout area FTA, disposed on the fourth insulating layer INS4 in the bent area BA, and disposed on the first insulating film INS1 in the pad area PA. In detail, the second pixel unit data line DL2a is disposed on the third insulating film INS3 in the display area DA, the second fanout line DL2b is disposed on the second insulating film INS2 in the fanout area FTA, the second link wire DL2c is disposed on the fourth insulating layer INS4 in the bent area BA, and the second connection wire DL2d is disposed on the first insulating film INS1 in the pad area PA.

The second pixel unit data line DL2a is connected to the second fanout line DL2b through a fourth contact hole CH3d, the second fanout line DL2b is connected to the second link wire DL2c through a fifth contact hole CH3e, and the second link wire DL2c is connected to the second connection wire DL2d through a sixth contact hole CH3f.

Figure 10:
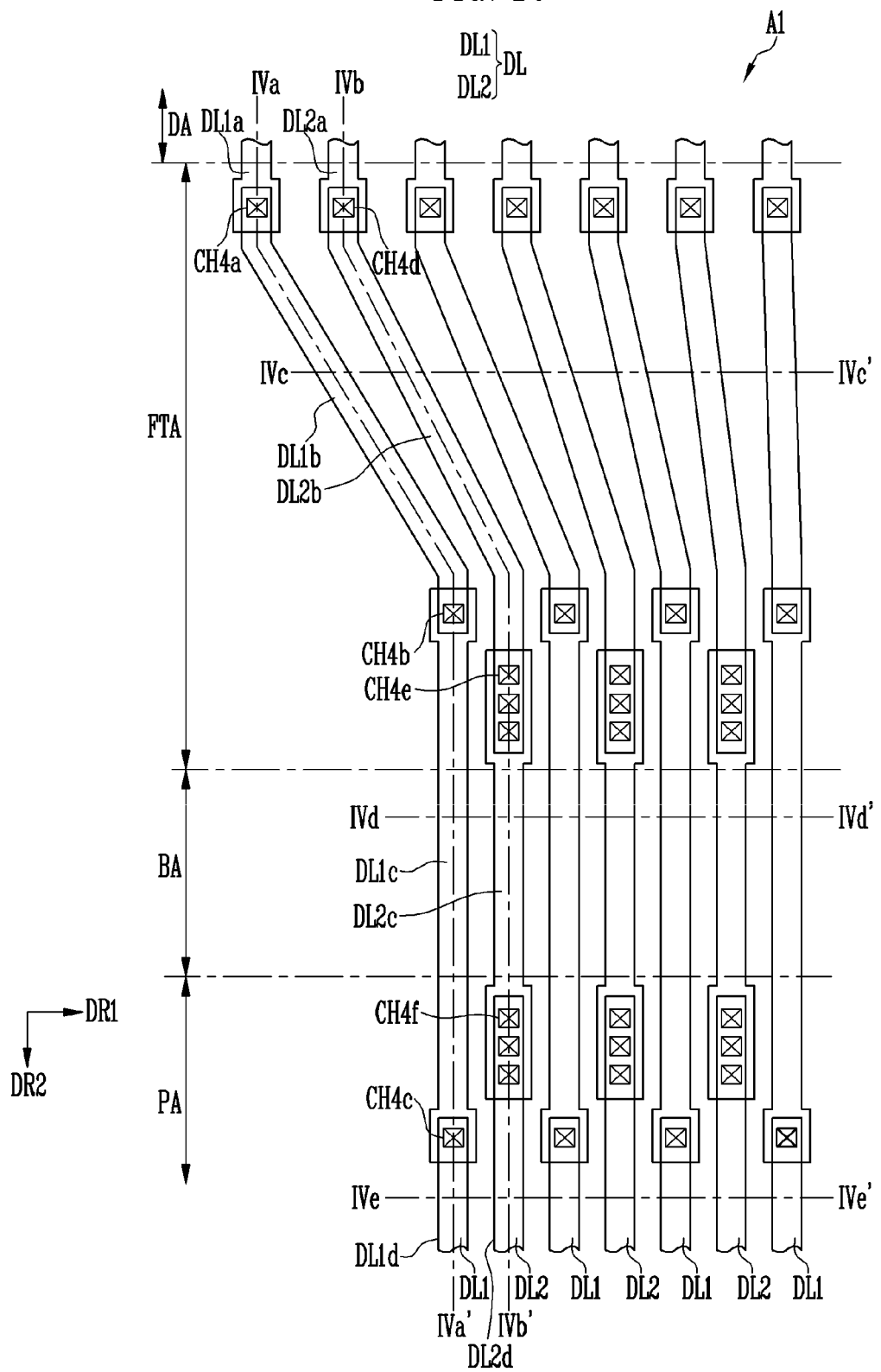
FIG. 10 illustrates the data lines of the display device according to an exemplary embodiment of the inventive concepts, and is a plan view illustrating the portion corresponding to A1 of FIG. 2.

FIG. 10 illustrates the data lines of the display device according to an exemplary embodiment of the inventive concepts and is a plan view illustrating the portion corresponding to A1 of FIG. 2.

Figure 11A:
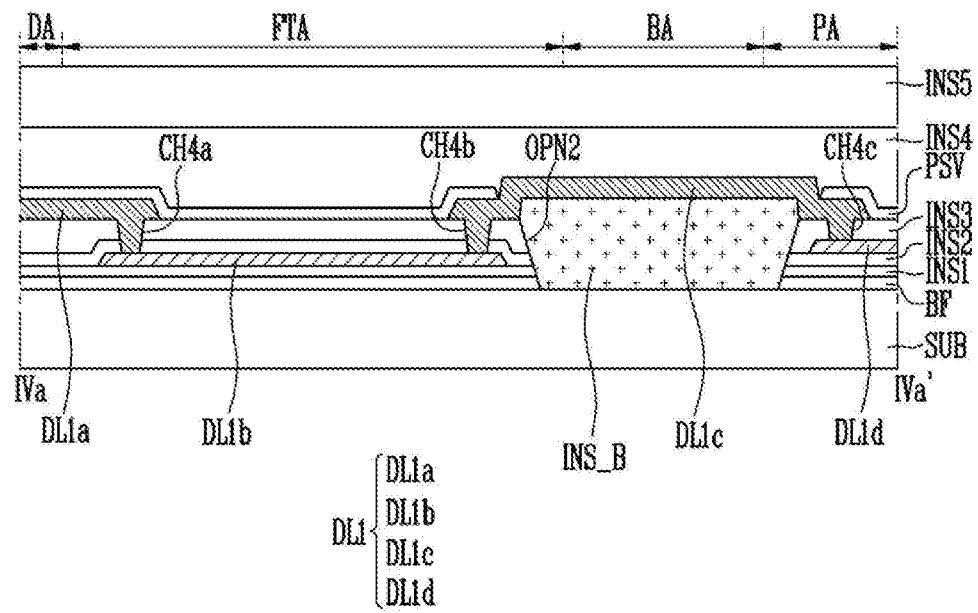
FIG. 11A is a cross sectional view taken along a line IVa-IVa' of FIG. 10.
Figure 11B:
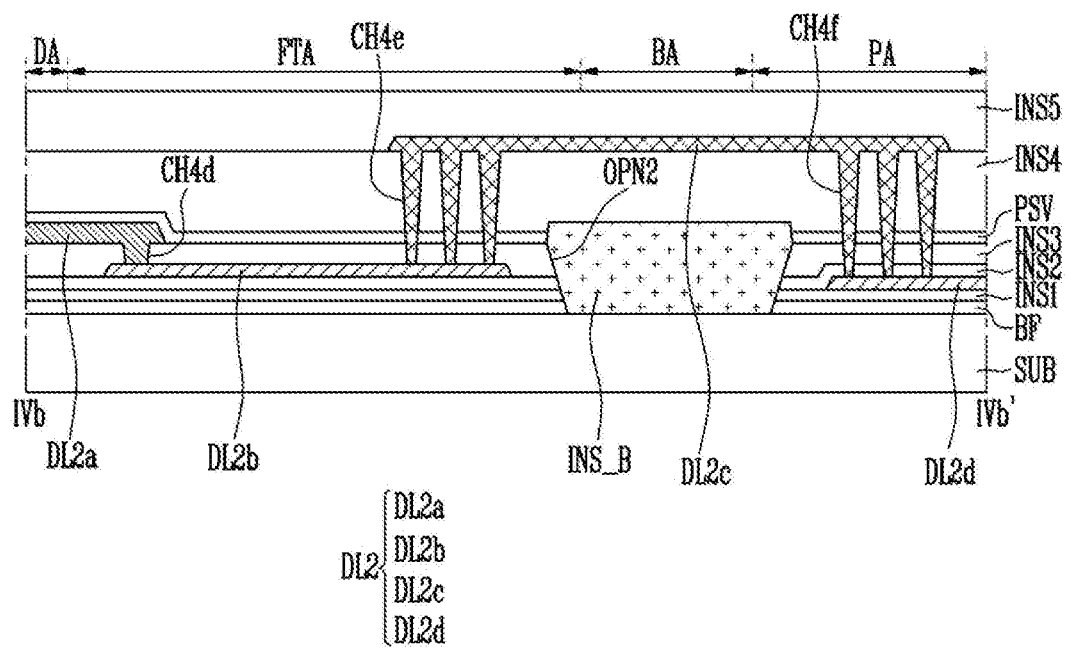
FIG. 11B is a cross sectional view taken along a line IVb-IVb' of FIG. 10.
Figure 11C:
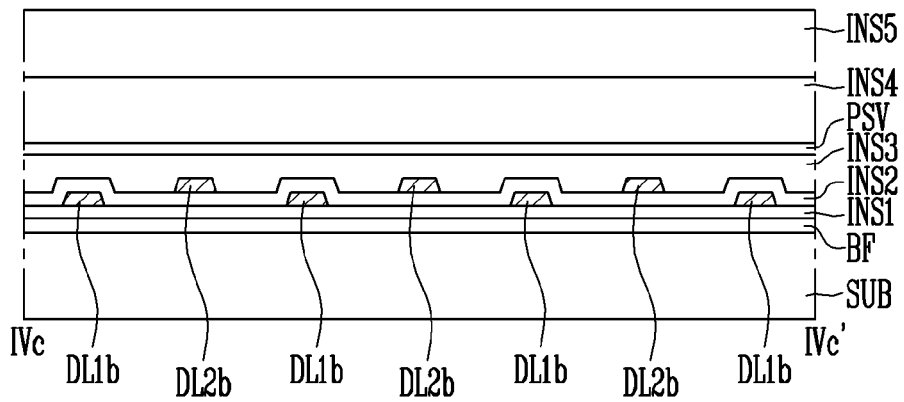
FIG. 11C is a cross sectional view taken along a line IVc-IVc' of FIG. 10.
Figure 11D:
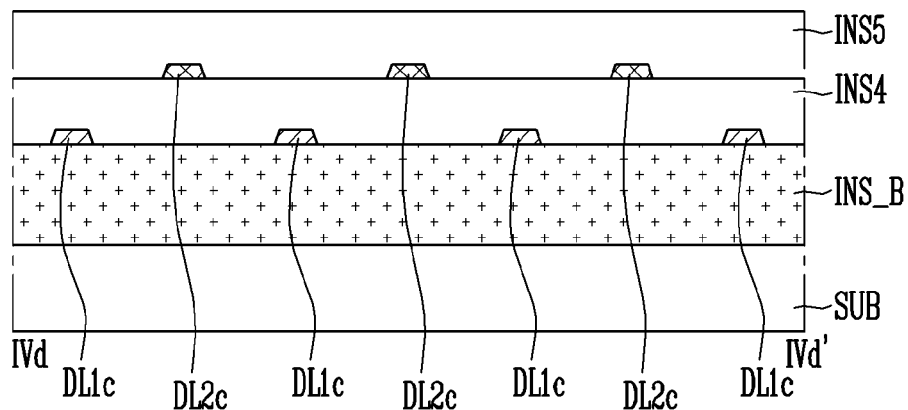
FIG. 11D is a cross sectional view taken along a line IVd-IVd' of FIG. 10.
Figure 11E:
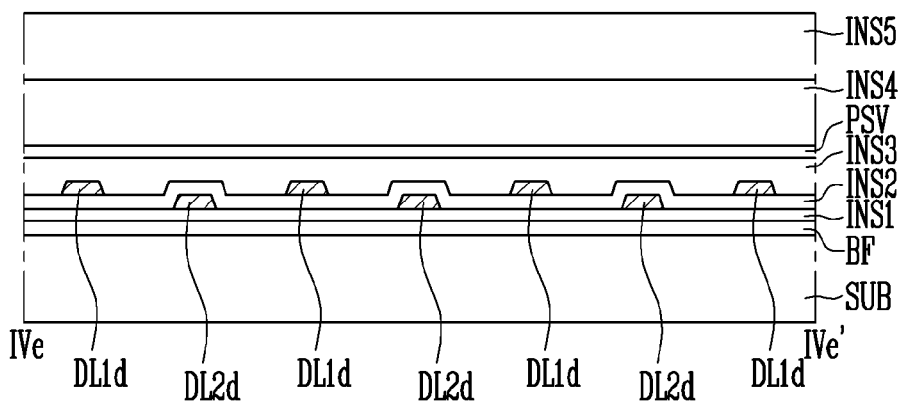
FIG. 11E is a cross sectional view taken along a line IVe-IVe' of FIG. 10.

FIG. 11A is a cross sectional view taken along a line IVa-IVa' of FIG. 10, FIG. 11B is a cross sectional view taken along a line IVb-IVb' of FIG. 10, FIG. 11C is a cross sectional view taken along a line IVc-IVc' of FIG. 10, FIG. 11D is a cross sectional view taken along a line IVd-IVd' of FIG. 10, and FIG. 11E is a cross sectional view taken along a line IVe-IVe' of FIG. 10.

Referring to FIG. 10 and FIG. 11A to FIG. 11E, the first data line and the second data line may be disposed on different layers from the layers described in the bent area.

The first data lines DL1 is disposed on the third insulating film INS3 in the display area DA, disposed on the first insulating film INS1 in the fanout area FTA, disposed on the bent portion insulating film INS_B in the bent area BA, and disposed on the second insulating film INS2 in the pad area PA. In detail, the first pixel unit data line DL1a is disposed on the third insulating film INS3 in the display area DA, the first fanout line DL1b is disposed on the first insulating film INS1 in the fanout area FTA, the first link wire DL1c is disposed on the bent portion insulating film INS_B in the bent area BA, and the first connection wire DL1d is disposed on the second insulating film INS2 in the pad area PA.

The first pixel unit data line DL1a is connected to the first fanout line DL1b through a first contact hole CH4a, the first fanout line DL1b is connected to the first link wire DL1c through a second contact hole CH4b, and the first link wire DL1c is connected to the first connection wire DL1d through a third contact hole CH4c.

The second data line DL2 is disposed on the third insulating film INS3 in the display area DA, disposed on the second insulating film INS2 in the fanout area FTA, disposed on the fourth insulating layer INS4 in the bent area BA, and disposed on the first insulating film INS1 in the pad area PA. In detail, the second pixel unit data line DL2a is disposed on the third insulating film INS3 in the display area DA, the second fanout line DL2b is disposed on the second insulating film INS2 in the fanout area FTA, the second link wire DL2c is disposed on the fourth insulating layer INS4 in the bent area BA, and the second connection wire DL2d is disposed on the first insulating film INS1 in the pad area PA.

The second pixel unit data line DL2a is connected to the second fanout line DL2b through a fourth contact hole CH4d, the second fanout line DL2b is connected to the second link wire DL2c through a fifth contact hole CH4e, and the second link wire DL2c is connected to the second connection wire DL2d through a sixth contact hole CH4f.

In the aforementioned exemplary embodiment, the first link wires DL1c of the first data lines DL1 and the second link wires DL2c of the second data lines DL2 are alternately arranged on a planar view. The first link wire DL1c is disposed on the bent portion insulating film INS_B, and the second link wire DL2c is disposed on the fourth insulating layer INS4.

As the first link wire DL1c and the second link wires DL2c have the aforementioned structure, a wider gap between adjacent data lines DL may be secured. If the data lines DL are disposed on one layer, a gap bet the adjacent data lines DL is narrower, but if the data lines DL are alternately disposed on two different layers, a gap between the adjacent the data lines DL on one layer is widened. With this, a degree of freedom for designing the data lines DL may increase.

Figure 12:
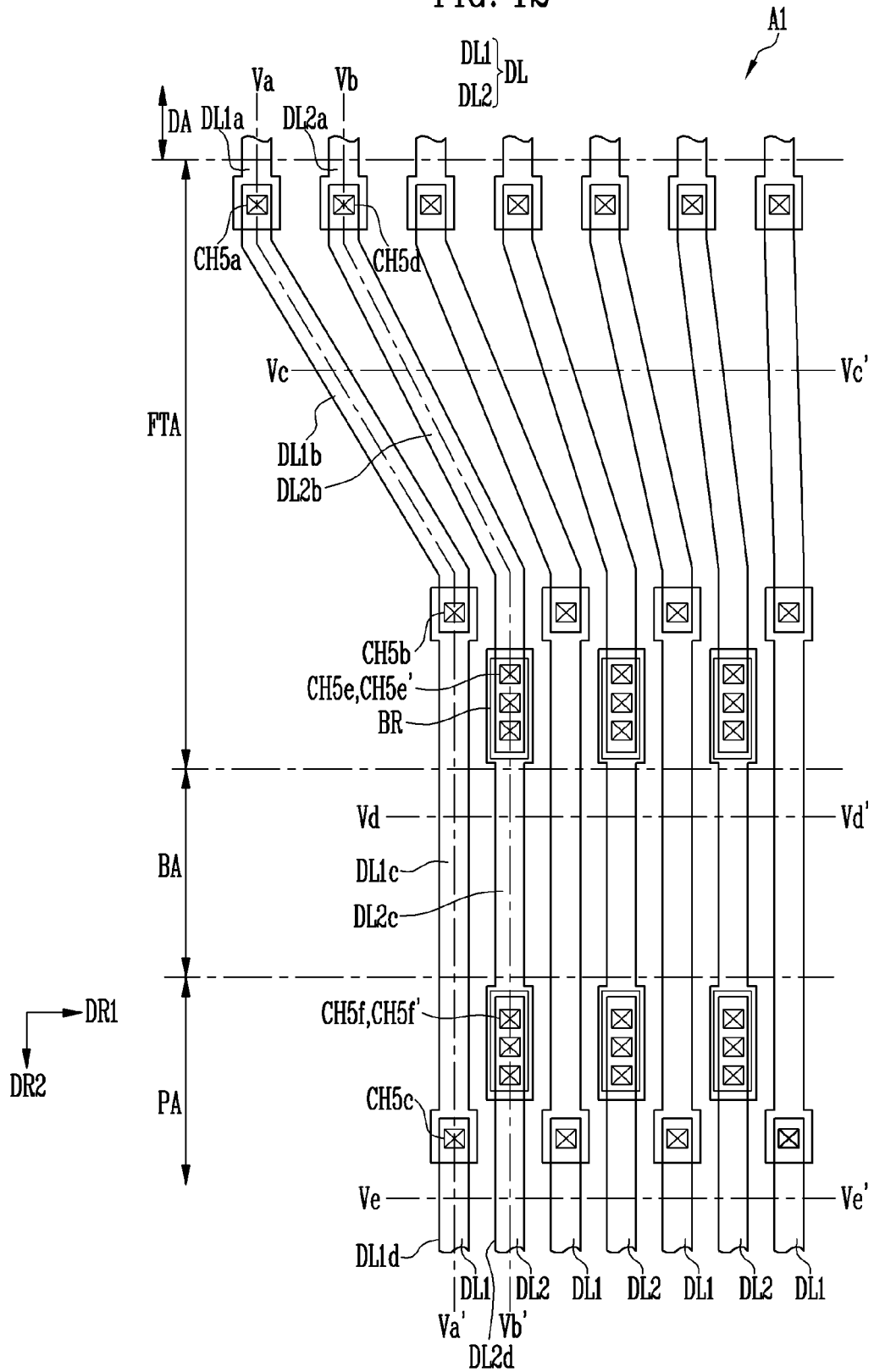
FIG. 12 illustrates the data lines of the display device according to an exemplary embodiment of the inventive concepts, and is a plan view illustrating the portion corresponding to A1 of FIG. 2.

FIG. 12 illustrates the data lines of the display device according to an exemplary embodiment of the inventive concepts and is a plan view illustrating the portion corresponding to A1 of FIG. 2.

Figure 13A:
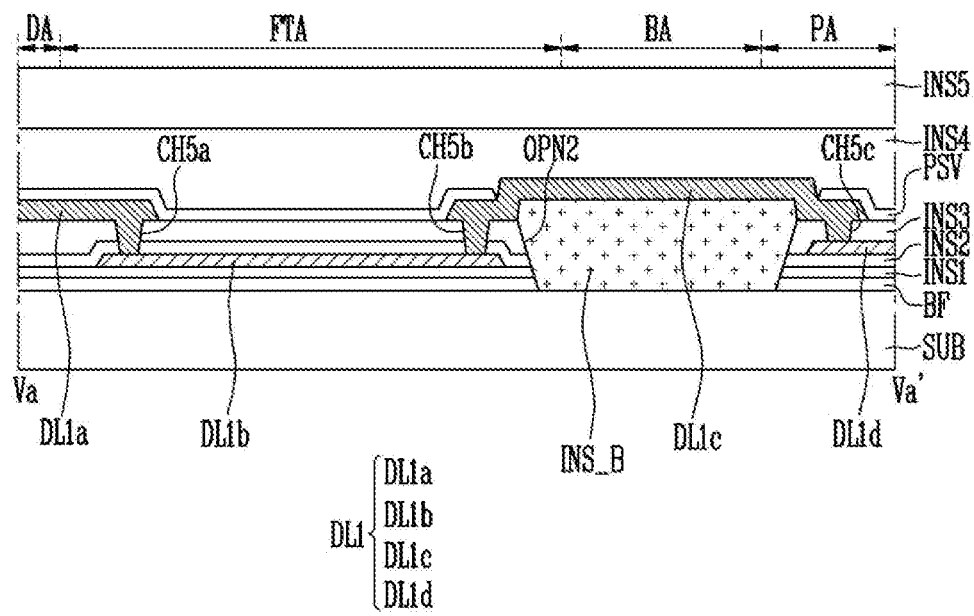
FIG. 13A is a cross sectional view taken along a line Va-Va' of FIG. 12.
Figure 13B:
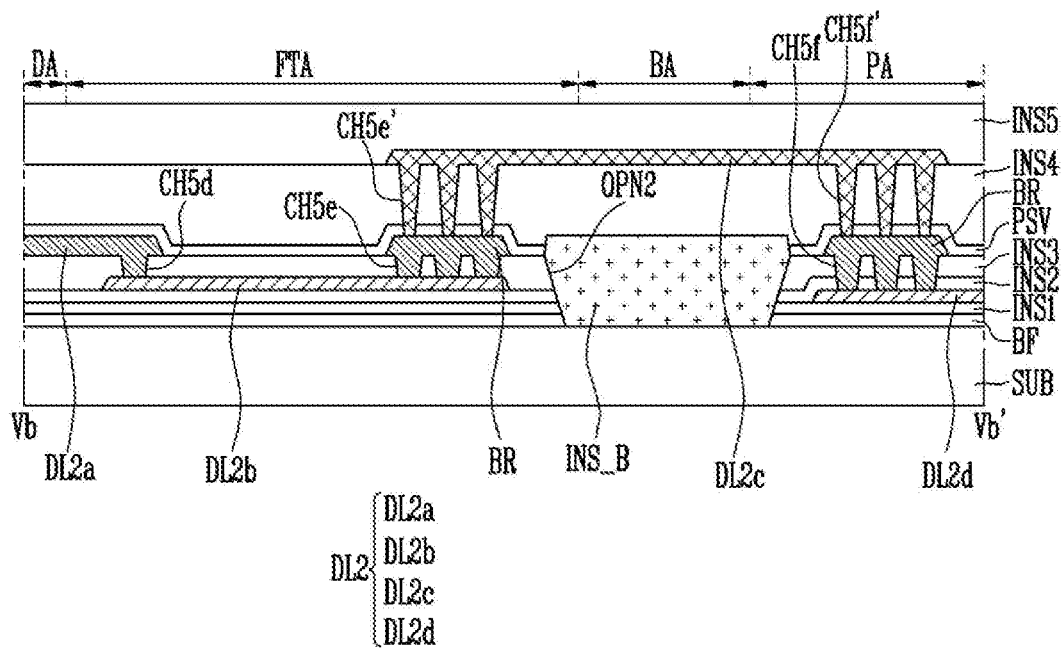
FIG. 13B is a cross sectional view taken along a line Vb-Vb' of FIG. 12.
Figure 13C:
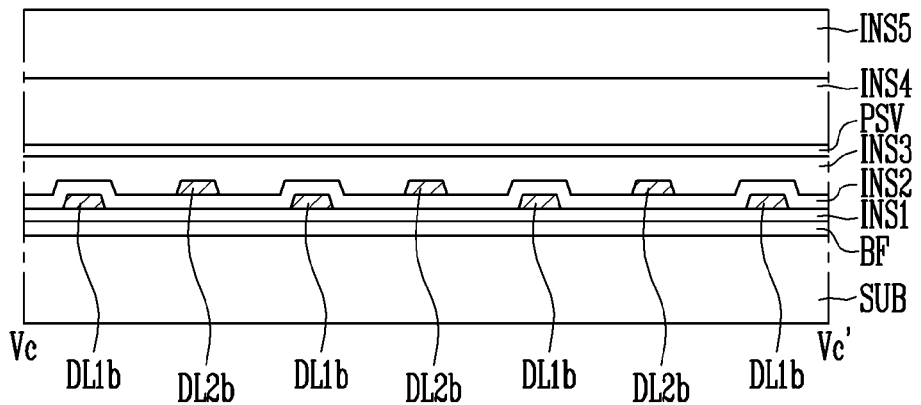
FIG. 13C is a cross sectional view taken along a line Vc-Vc' of FIG. 12.
Figure 13D:
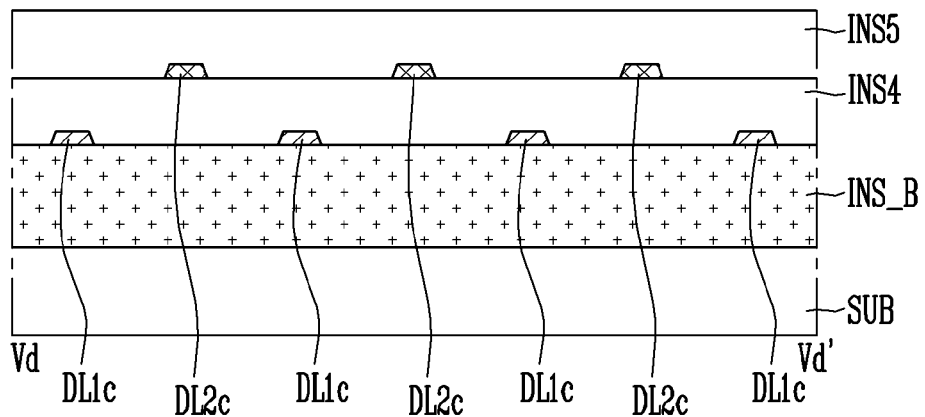
FIG. 13D is a cross sectional view taken along a line Vd-Vd' of FIG. 12.
Figure 13E:
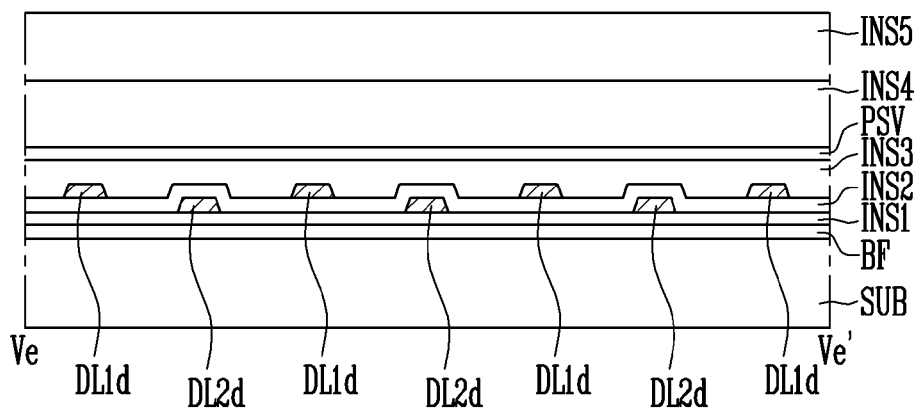
FIG. 13E is a cross sectional view taken along a line Ve-Ve' of FIG. 12.

FIG. 13A is a cross sectional view taken along a line Va-Va' of FIG. 12, FIG. 13B is a cross sectional view taken along a line Vb-Vb' of FIG. 12, FIG. 13C is a cross sectional view taken along a line Vc-Vc' of FIG. 12, FIG. 13D is a cross sectional view taken along a line Vd-Vd' of FIG. 12, and FIG. 13E is a cross sectional view taken along a line Ve-Ve' of FIG. 12.

Referring to FIG. 12 and FIG. 13A to FIG. 13E, the first data line and the second data line may be disposed with different structures from the structures described in the aforementioned exemplary embodiments in the bent area.

The first data lines DL1 is disposed on the third insulating film INS3 in the display area DA, disposed on the first insulating film INS1 in the fanout area FTA, disposed on the bent portion insulating film INS_B in the bent area BA, and disposed on the second insulating film INS2 in the pad area PA. In detail, the first pixel unit data line DL1a is disposed on the third insulating film INS3 in the display area DA, the first fanout line DL1b is disposed on the first insulating film INS1 in the fanout area FTA, the first link wire DL1c is disposed on the bent portion insulating film INS_B in the bent area BA, and the first connection wire DL1d is disposed on the second insulating film INS2 in the pad area PA.

The first pixel unit data line DL1a is connected to the first fanout line DL1b through a first contact hole CH5a, the first fanout line DL1*b* is connected to the first link wire DL1*c* through a second contact hole CH5*b*, and the first link wire DL1*c* is connected to the first connection wire DL1*d* through a third contact hole CH5*c*.

The second data line DL2 is disposed on the third insulating film INS3 in the display area DA, disposed on the second insulating film INS2 in the fanout area FTA, disposed on the fourth insulating layer INS4 in the bent area BA, and disposed on the first insulating film INS1 in the pad area PA. In detail, the second pixel unit data line DL2*a* is disposed on the third insulating film INS3 in the display area DA, the second fanout line DL2*b* is disposed on the second insulating film INS2 in the fanout area FTA, the second link wire DL2*c* is disposed on the fourth insulating layer INS4 in the bent area BA, and the second connection wire DL2*d* is disposed on the first insulating film INS1 in the pad area PA.

Here, the second fanout line DL2*b* is connected to the second link wire DL2*c* through a bridge BR disposed on the third insulating film INS3, and the second link wire DL2*c* is connected to the second connection wire DL2*d* through the bridge BR disposed on the third insulating film INS3. Accordingly, the second pixel unit data line DL2*a* is connected to the second fanout line DL2*b* through a third contact hole CH5*d*, the second fanout line DL2*b* is connected to the second link wire DL2*c* through fifth contact holes CH5*e* and CH5*e'*, and the second link wire DL2*c* is connected to the second connection wire DL2*d* through sixth contact holes CH5*f* and CH5*f'*.

In the an exemplary embodiment, the first link wires DL1*c* of the first data lines DL1 and the second link wires DL2*c* of the second data lines DL2 are disposed on different layers from each other, and are alternately disposed on a planar view. With this, a degree of freedom for designing the data lines DL may increase.

Figure 14:
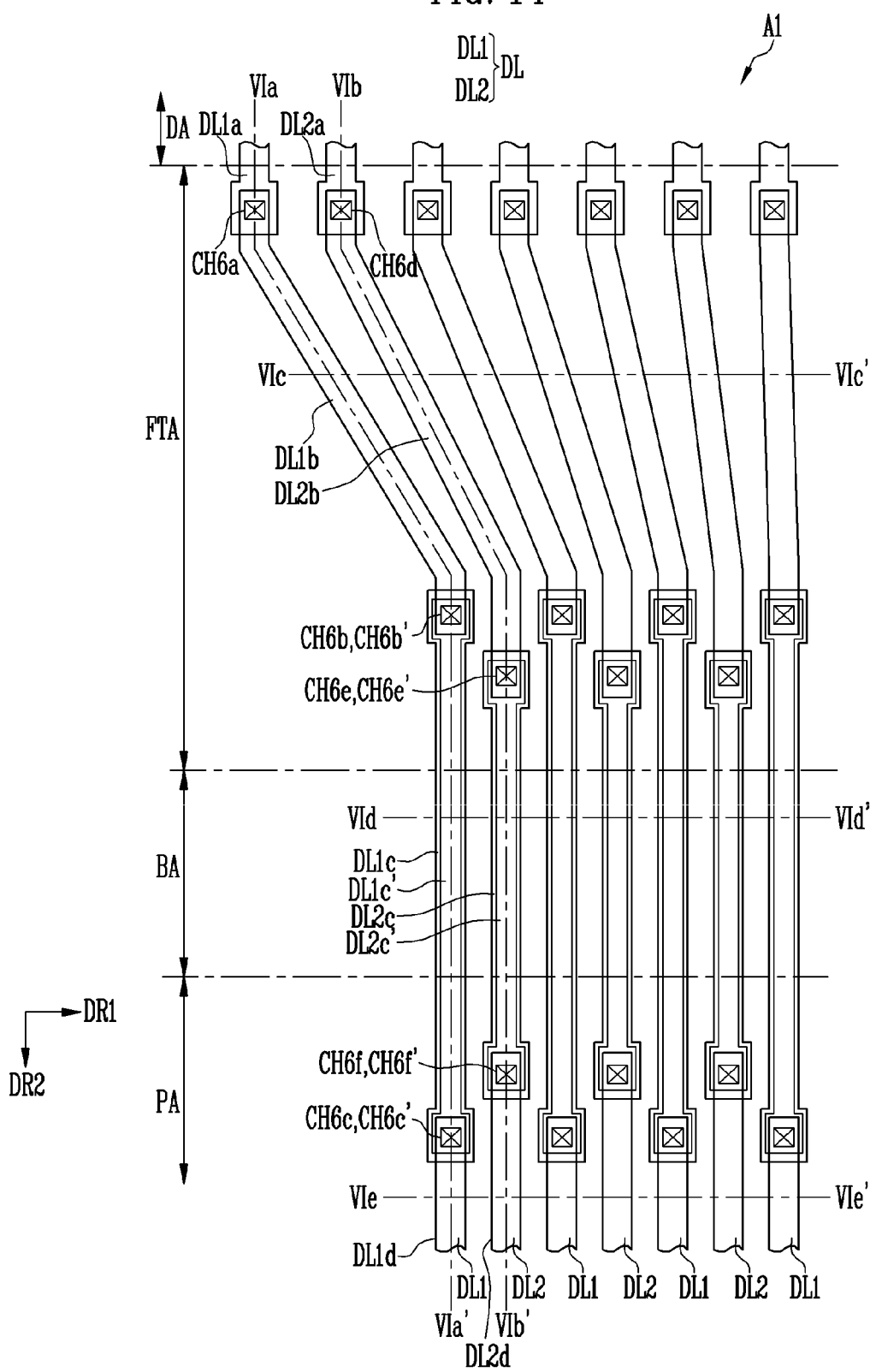
FIG. 14 is illustrates the data lines of the display device according to an exemplary embodiment of the inventive concepts, and is a plan view illustrating the portion corresponding to A1 of FIG. 2.

FIG. 14 is illustrates the data lines of the display device according to an exemplary embodiment of the inventive concepts and is a plan view illustrating the portion corresponding to A1 of FIG. 2.

Figure 15A:
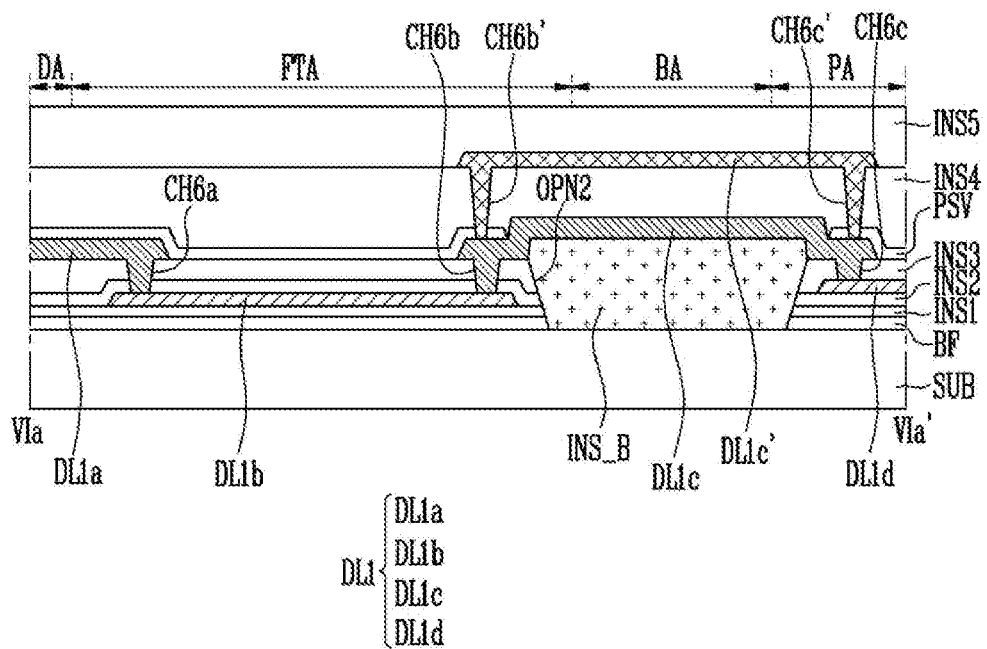
FIG. 15A is a cross sectional view taken along a line VIa-VIa' of FIG. 14.
Figure 15B:
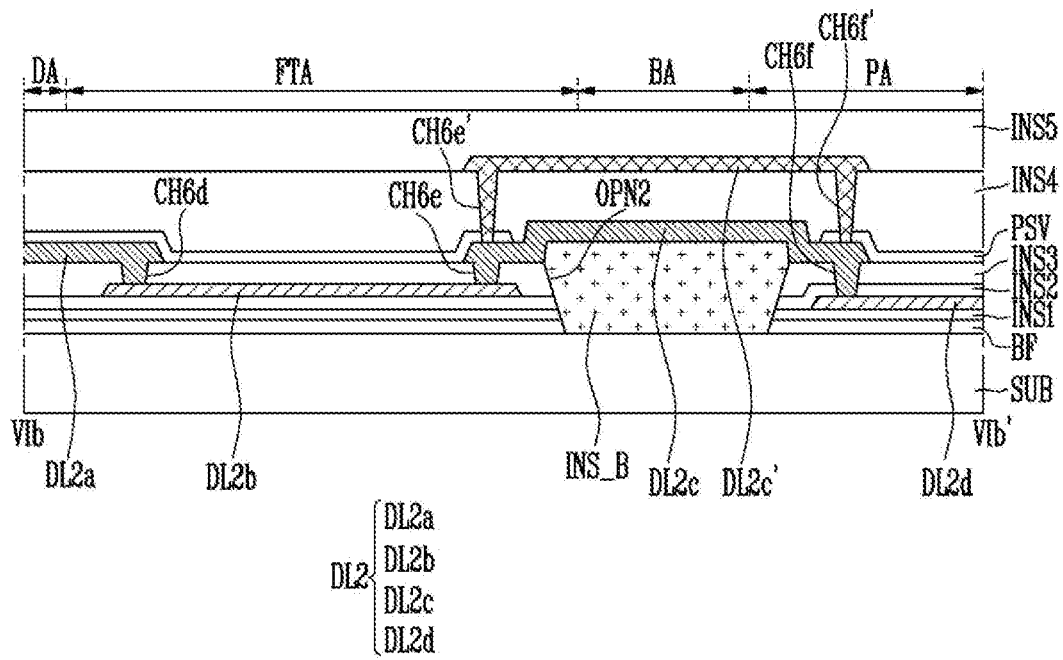
FIG. 15B is a cross sectional view taken along a line VIb-VIb' of FIG. 14.
Figure 15C:
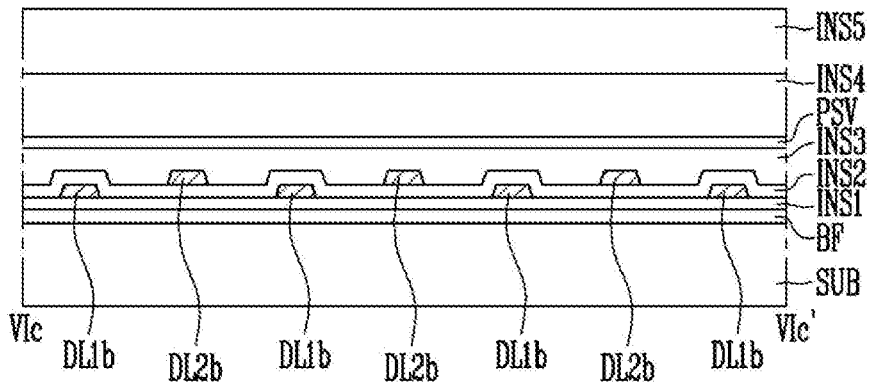
FIG. 15C is a cross sectional view taken along a line VIc-VIc' of FIG. 14.
Figure 15D:
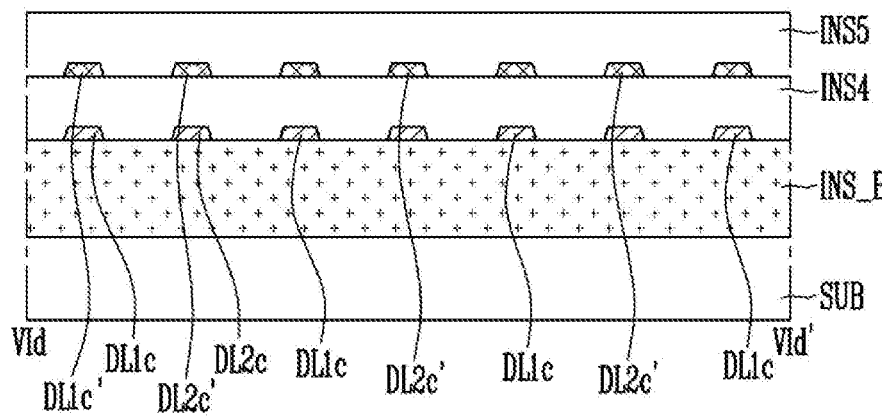
FIG. 15D is a cross sectional view taken along a line VId-VId' of FIG. 14.
Figure 15E:
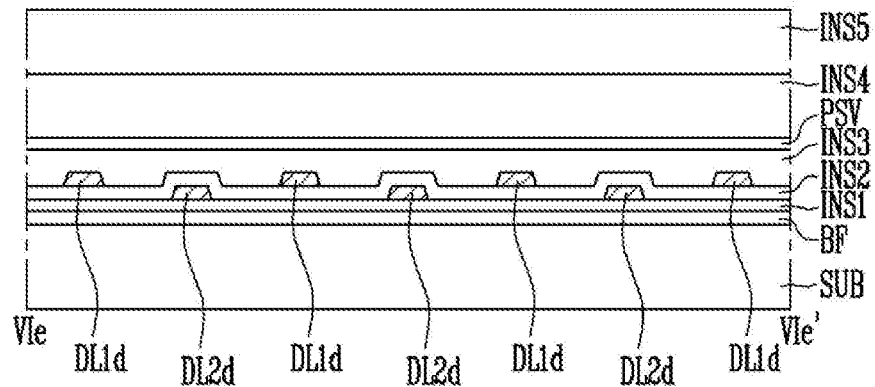
FIG. 15E is a cross sectional view taken along a line VIe-VIe' of FIG. 14.

FIG. 15A is a cross sectional view taken along a line VIa-VIa' of FIG. 14, FIG. 15B is a cross sectional view taken along a line VIb-VIb' of FIG. 14, FIG. 15C is a cross sectional view taken along a line VIc-VIc' of FIG. 14, FIG. 15D is a cross sectional view taken along a line VId-VId' of FIG. 14, and FIG. 15E is a cross sectional view taken along a line VIe-VIe' of FIG. 14.

The first data lines DL1 is disposed on the third insulating film INS3 in the display area DA, disposed on the first insulating film INS1 in the fanout area FTA, disposed on the bent portion insulating film INS_B and the fourth insulating layer INS4 in the bent area BA, and disposed on the second insulating film INS2 in the pad area PA. In detail, the first pixel unit data line DL1*a* is disposed on the third insulating film INS3 in the display area DA, the first fanout line DL1*b* is disposed on the first insulating film INS1 in the fanout area FTA, the first link wire DL1*c* is disposed on the bent portion insulating film INS_B and the fourth insulating layer INS4 in the bent area BA, and the first connection wire DL1*d* is disposed on the second insulating film INS2 in the pad area PA. In other words, the first data lines DL1 are disposed as two lines DL1*c* and DL1*c'* which are respectively disposed on the bent portion insulating film INS_B and the fourth insulating layer INS4 in the bent area BA. The two lines DL1*c* and DL1*c'* may overlap each other on a planar view.

The first pixel unit data line DL1*a* is connected to the first fanout line DL1*b* through a first contact hole CH6*a*, the first fanout line DL1*b* is connected to the two first link wires DL and DL1*c'* through second contact holes CH6*b* and CH6*b'*. The first link wire DL is connected to the first connection wire DL1*d* through third contact holes CH6*c* and CH6*c'*.

The second data line DL2 is disposed on the third insulating film INS3 in the display area DA, disposed on the second insulating film INS2 in the fanout area FTA, disposed on the bent portion insulating film INS_B and the fourth insulating layer INS4 in the bent area BA, and disposed on the first insulating film INS1 in the pad area PA. In detail, the second pixel unit data line DL2*a* is disposed on the third insulating film INS3 in the display area DA, the second fanout line DL2*b* is disposed on the second insulating film INS2 in the fanout area FTA, the second link wire DL2*c* is disposed on the bent portion insulating film INS_B and the fourth insulating layer INS4 in the bent area BA, and the second connection wire DL2*d* is disposed on the first insulating film INS1 in the pad area PA. In other words, the second data lines DL2 are provided as two lines DL2*c* and DL2*c'* which are respectively disposed on the bent portion insulating film INS_B and the fourth insulating layer INS4 in the bent area BA. The two lines DL2*c* and DL2*c'* may overlap each other on a planar view.

The second pixel unit data line DL2*a* is connected to the second fanout line DL2*b* through a fourth contact hole CH6*d*, the second fanout line DL2*b* is connected to two second link wire DL2*c* and DL2*c'* through fifth contact holes CH6*e* and CH6*e'*. The second link wire DL2*c* is connected to the second connection wire DL2*d* through sixth contact holes CH6*f* and CH6*f'*.

In the an exemplary embodiment, as a plurality of the first data lines DL1 and a plurality of the second data lines DL2 are provided, resistances of the first link wire DL1*c* and the second link wires DL2*c* may be reduced or minimized.

In the an exemplary embodiment, as resistance value difference between the first data lines DL1 and the second data lines DL2 are reduced or minimized, contact structures between the first data line DL1 and the second data line DL2 in particular may not be set differently. In an exemplary embodiment of the inventive concepts, a contact structure in which each portion of the first data lines DL1 and the second data lines DL2 is connected in the non-display area NDA is set differently, it is possible to additionally reduce the resistance value difference between the two data lines DL2. For example, the contact structure with relatively small resistance may be formed in the wire whose entire resistance is determined to be high, among the first data line DL1 and the second data line DL2, and thus, more contact holes may be provided in the data line with a larger delay value of a data signal.

As described above, the structures of the data lines may vary in the display device according to an exemplary embodiment of the inventive concepts.

In an exemplary embodiment of the inventive concepts, the various drive units may be provided. In the aforementioned exemplary embodiments, the data drive unit, which is provided in an additional area, of the drive unit is illustrated, but the drive unit may be formed differently.

Figure 16:
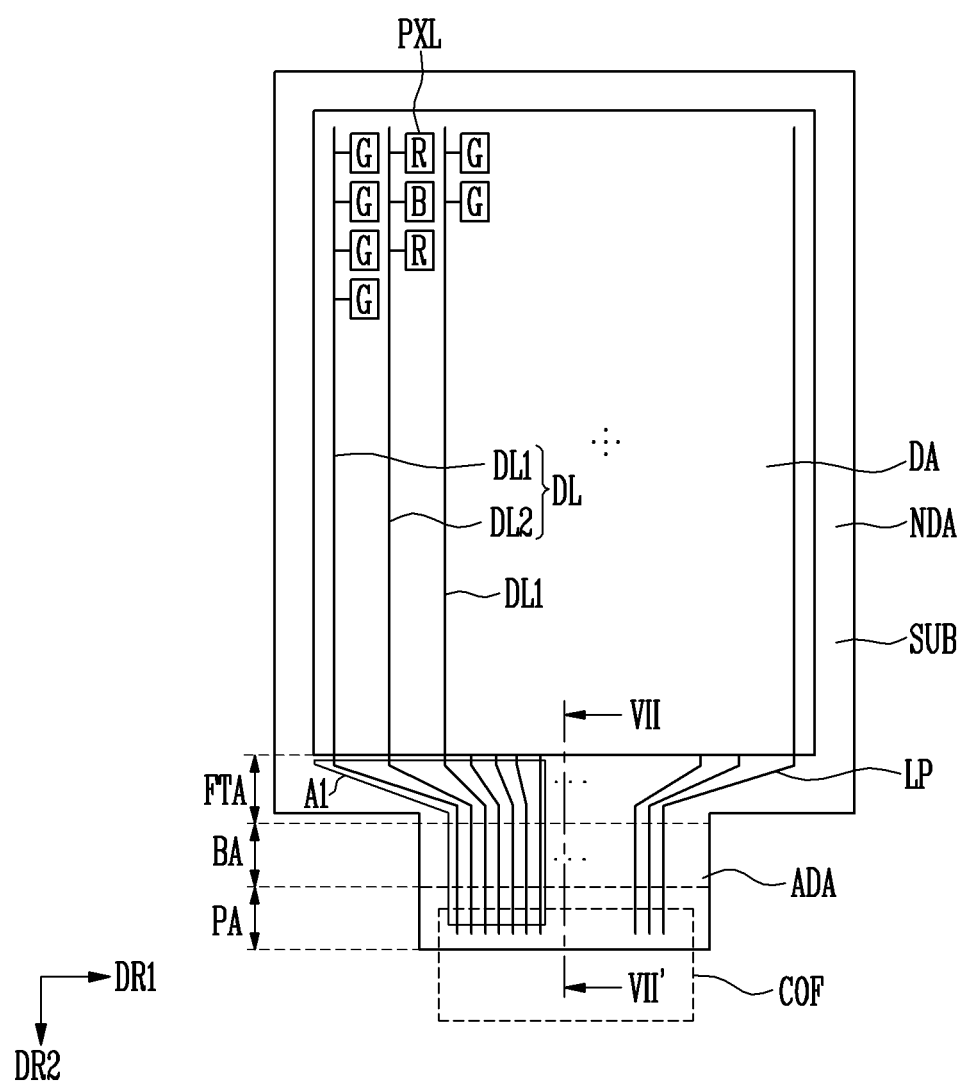
FIG. 16 is a plan view illustrating the display device of FIG. 1 according to an exemplary embodiment of the inventive concepts.
Figure 17:
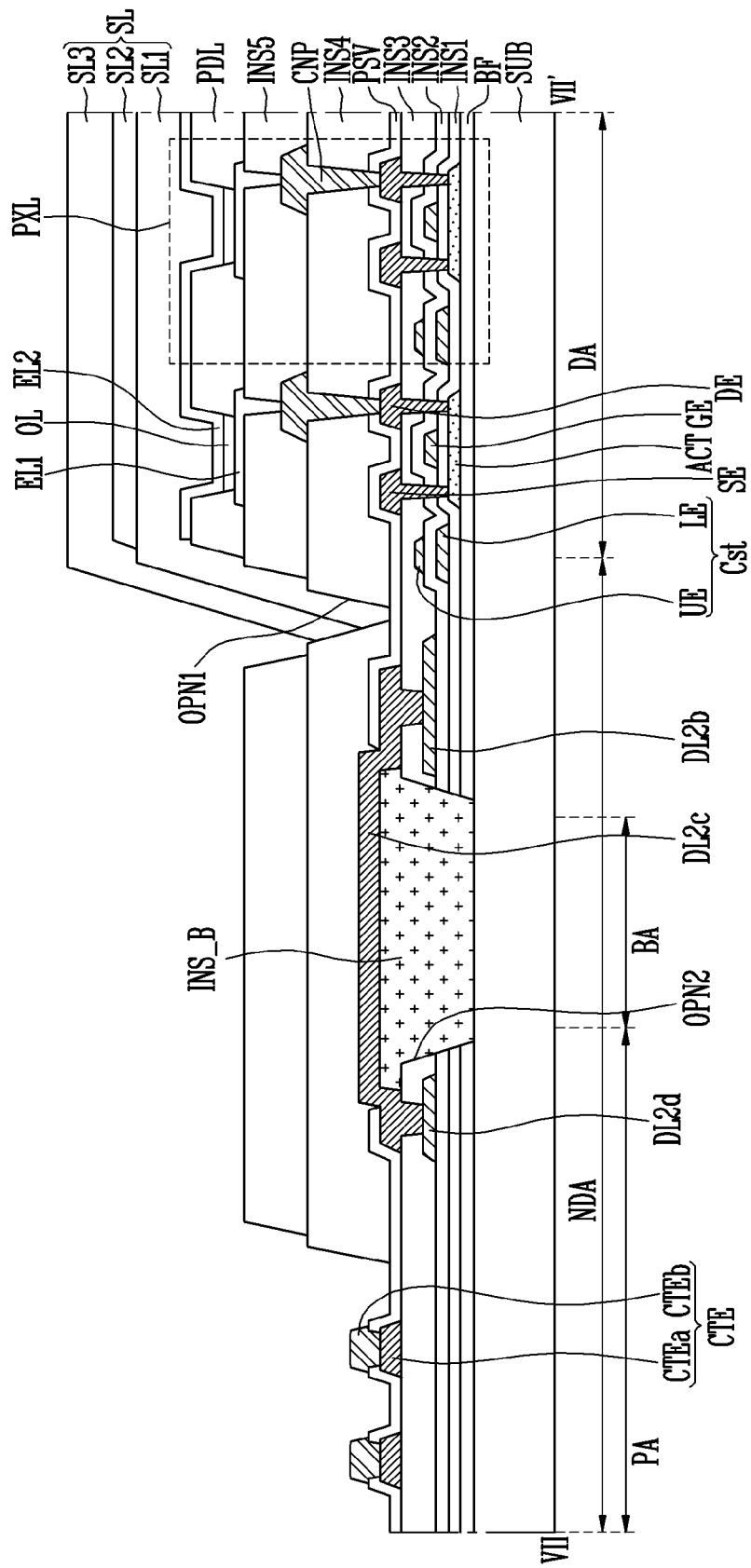
FIG. 17 is a cross sectional view taken along a line VII-VII' of FIG. 16 and illustrates a part of the pixels in the display region and a non-display region.

FIG. 16 is a plan view illustrating the display device according to an exemplary embodiment of the inventive concepts. FIG. 17 is a cross sectional view taken along a line VII-VII' of FIG. 16, and illustrates a part of the pixels in the display region, and a non-display region.

Referring to FIGS. 16 and 17, the drive unit according to an exemplary embodiment of the inventive concepts may be provided not as a display substrate but as another configuration element such as, for example, a chip on film shape or a chip on glass shape. Alternatively, the drive unit may be mounted on a printed circuit board and may be connected to the substrate SUB through a connection member such as an anisotropic conductive film. FIG. 16 illustrates an exemplary embodiment of the inventive concepts, where the data drive unit which is manufactured in a shape of a chip on film (COF) and is connected to the substrate SUB.

In an exemplary embodiment, the contact electrodes CTE may be disposed in an end portion of the data lines. The pixels PXL may be connected to the drive unit realized by a printed circuit board or the like through the contact electrodes CTE connected to the wires.

In an exemplary embodiment of the inventive concepts, a green pixel, a red pixel, and a blue pixel may be described as pixels representing first to third colors as an example, but the green pixel, the red pixel, and the blue pixel may be applied to pixels representing other colors within a range without departing from the concept of the inventive concepts.

An exemplary embodiment of the inventive concepts discloses that defects caused by a resistance difference due to positions or shapes of the data lines may be reduced or prevented, as an example. An exemplary embodiment of the inventive concepts may also be applied where defects occur due to other reasons in which a delay of a signal occurs, for example, a swing width difference between data voltages depending on a color.

According to the display device having the aforementioned exemplary embodiments, a resistance difference between the first data line and the second data line may be reduced, and thereby, defects according to the resistance difference may be reduced.

The display device according to an exemplary embodiment of the inventive concepts may be employed in various electronic devices. For example, the display device may be applied to various wearable apparatuses, such as, a television, a notebook, a cell phone, a smart phone, a smart pad, a PMP, a PDA, a navigation device, or a smart watch, etc.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device, comprising:
  a substrate comprising a display area and a non-display area;
  pixels disposed on the display area, the pixels being arranged in pixel columns;
  data lines respectively connected to the pixel columns, the data lines being configured to apply data signals to the pixel columns; and
  a data drive unit coupled to one side of the substrate via a chip on film configuration, the data drive unit being configured to provide a data signal to the data lines,
  wherein the non-display area comprises a fan-out area, a bent area, and a pad area that are sequentially arranged,
  wherein each data line of the display device comprises a first portion disposed on the fan-out area and a second portion disposed on the pad area,
  wherein the first portion of each data line and the second portion of each data line adjacent to the first portion are disposed on different layers and not in a same layer, and
  wherein the second portion of each data line is connected to the data drive unit.

2. The display device of claim 1, wherein:
  each data line further comprises a third portion on the bent area; and
  the first and second portions of each data line are disposed in a lower layer than the third portion of each data line.

3. The display device of claim 2, wherein the plurality of pixel columns comprises:
  a first pixel column comprising a first plurality of the pixels; and
  a second pixel column comprising a second plurality of the pixels.

4. The display device of claim 3, wherein:
  the data lines comprise a first data line connected to the first pixel column and a second data line connected to the second pixel column;
  the first portion of the first data line is disposed in a different layer than the first portion of the second data line; and
  the second portion of the first data line is disposed in a different layer than the second portion of the second data line.

5. The display device of claim 4, further comprising:
  first to third insulating films sequentially disposed on the substrate, and
  a bent portion insulating film disposed on the bent area, wherein:
    the first portion of the first data line is disposed on one layer of the first and second insulating films such that the one layer is disposed between the first portion of the first data line and the substrate; and
    the second portion of the first data line is disposed on the other layer of the first and second insulating films such that the other layer is disposed between the second portion of the first data line and the substrate.

6. The display device of claim 5, wherein:
  the first portion of the second data line is disposed on the other layer such that the other layer is disposed between the first portion of the second data line and the substrate; and
  the second portion of the second data line is disposed on the one layer such that the one layer is disposed between the second portion of the second data line and the substrate.

7. The display device of claim 6, wherein:
  the first to third insulating films comprise openings, which expose a part of the bent area,
  the bend portion insulating film is disposed in each of the openings, and
  the third portion of each data line is disposed on the bent portion insulating film.

8. The display device of claim 7, further comprising:
  a fourth insulating film disposed on the third insulating film and the bent portion insulating film such that each of the third insulating film and the bent portion insulating film is disposed between the fourth insulating film and the substrate.

9. The display device of claim 8, wherein:
  the third portion of the first data line is disposed on one layer of the bent portion insulating film and the fourth insulating film in the bent area such that the one layer is disposed between the third portion of the first data line and the bent area; and
  the third portion of the second data line is disposed on the other layer of the bent portion insulating film and the fourth insulating film such that the other layer is disposed between the third portion of the second data line and the bent area.

10. The display device of claim 8, wherein the third portion of each data line is disposed on the bent portion insulating film and the fourth insulating film such that each of the bent portion insulating film and the fourth insulating film is disposed between the third portion and the bent area.

11. The display device of claim 4, wherein:
the first pixel column is one of a plurality of first pixel columns;
the second pixel column is one of a plurality of second pixel columns; and
the first pixel columns are alternately arranged with the second pixel columns in a row direction.

12. The display device of claim 11, wherein:
the first data line is one of a plurality of first data lines;
the second data line is one of a plurality of second data lines; and
the first data lines are alternately arranged with the second data lines in the row direction.

13. The display device of claim 4, wherein:
each of the first plurality of the pixels represent a first color;
a first some of the second plurality of the pixels represent a second color different from the first color;
a second some of the second plurality of the pixels represent a third color different from each of the first color and the second color; and
the first some of the second plurality of the pixels are alternately arranged with the second some of the second plurality of the pixels in a column direction.

14. The display device of claim 13, wherein the first color is green, the second color is red, and the third color is blue.

15. The display device of claim 13, wherein:
in association with the display area, delays of data signals applied to the first pixel column and the second pixel column are different from each other; and
the display device further comprises a contact structure in which the first data line, which is connected to the first pixel column, and the second data line, which is connected to the second pixel column, have different resistances from each other.

16. The display device of claim 15, wherein:
in association with the display area, a delay value of a signal applied to the first data line is greater than a delay value of a signal applied to the second data line; and
a resistance of a contact structure connected to the first data line in the non-display area is lower than a resistance of a contact structure connected to the second data line in the non-display area.

17. The display device of claim 16, wherein, in the non-display area, the first data line comprises less contact holes than the second data line.

* * * * *